(12) United States Patent
Kotera et al.

(10) Patent No.: US 10,141,204 B2
(45) Date of Patent: Nov. 27, 2018

(54) FILM, METHOD FOR ITS PRODUCTION, AND METHOD FOR PRODUCING SEMICONDUCTOR ELEMENT USING THE FILM

(71) Applicant: ASAHI GLASS COMPANY, LIMITED, Chiyoda-ku (JP)

(72) Inventors: Seigo Kotera, Chiyoda-ku (JP);
Wataru Kasai, Chiyoda-ku (JP);
Masami Suzuki, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/662,432

(22) Filed: Jul. 28, 2017

(65) Prior Publication Data

US 2017/0323805 A1    Nov. 9, 2017

Related U.S. Application Data

(63) Continuation of application No. PCT/JP2016/053072, filed on Feb. 2, 2016.

(30) Foreign Application Priority Data

Feb. 6, 2015  (JP) ................................. 2015-022691

(51) Int. Cl.
*H01L 21/56* (2006.01)
*B29C 33/68* (2006.01)
(Continued)

(52) U.S. Cl.
CPC ............ *H01L 21/565* (2013.01); *B29C 33/68* (2013.01); *B32B 27/00* (2013.01); *B32B 27/30* (2013.01);
(Continued)

(58) Field of Classification Search
None
See application file for complete search history.

(56) References Cited

U.S. PATENT DOCUMENTS

2011/0084413 A1* 4/2011 Shishido ............ C08G 59/4261
257/798
2016/0208144 A1* 7/2016 Usugi ........................ C09J 7/20

FOREIGN PATENT DOCUMENTS

JP    2001-250838    9/2001
JP    2002-158242    5/2002
(Continued)

OTHER PUBLICATIONS

International Search Report dated Apr. 19, 2016 in PCT/JP2016/053072, filed on Feb. 2, 2016.

*Primary Examiner* — Shaun Campbell
(74) *Attorney, Agent, or Firm* — Oblon, McClelland, Maier, Neustadt, L.L.P.

(57) ABSTRACT

To provide a film which is excellent in releasing property with respect to a resin sealed portion and excellent in low migration property and peeling property with respect to a semiconductor chip, a source electrode or a sealing glass and which is suitable as a mold release film for producing a semiconductor element having a part of the surface of a semiconductor chip, source electrode or sealing glass exposed. A film 1 which comprises a substrate 3 and an adhesive layer 5, wherein the storage elastic modulus at 180° C. of the substrate 3 is from 10 to 100 MPa, and the adhesive layer 5 is a reaction cured product of a composition for adhesive layer comprising a specific acrylic polymer and a polyfunctional isocyanate compound, wherein the number of moles $M_{OH}$ of hydroxy groups and the number of moles $M_{COOH}$ of carboxy groups, derived from the acrylic polymer, and the number of moles $M_{NCO}$ of isocyanate groups derived from the polyfunctional isocyanate compound, sat- (Continued)

isfy a specific relation, and which is suitable as a mold release film for producing a semiconductor element.

15 Claims, 3 Drawing Sheets

(51) Int. Cl.
| | |
|---|---|
| B32B 27/00 | (2006.01) |
| B32B 27/30 | (2006.01) |
| C09J 133/00 | (2006.01) |
| C09J 175/04 | (2006.01) |
| C08F 290/06 | (2006.01) |
| C08G 18/48 | (2006.01) |
| C08G 18/75 | (2006.01) |
| C08K 9/10 | (2006.01) |
| H01L 23/29 | (2006.01) |
| H01L 23/31 | (2006.01) |
| H01L 23/433 | (2006.01) |
| H01L 23/495 | (2006.01) |
| H01L 27/14 | (2006.01) |
| C08G 18/62 | (2006.01) |
| C08G 18/79 | (2006.01) |
| C08G 18/80 | (2006.01) |
| C08K 5/00 | (2006.01) |
| C09J 133/06 | (2006.01) |
| C08L 65/00 | (2006.01) |
| C09J 7/38 | (2018.01) |
| C09J 7/22 | (2018.01) |
| C09J 7/24 | (2018.01) |

(52) U.S. Cl.
CPC ...... *C08F 290/067* (2013.01); *C08G 18/4854* (2013.01); *C08G 18/6229* (2013.01); *C08G 18/6262* (2013.01); *C08G 18/757* (2013.01); *C08G 18/792* (2013.01); *C08G 18/8029* (2013.01); *C08K 5/0075* (2013.01); *C08K 9/10* (2013.01); *C08L 65/00* (2013.01); *C09J 7/22* (2018.01); *C09J 7/24* (2018.01); *C09J 7/38* (2018.01); *C09J 133/00* (2013.01); *C09J 133/066* (2013.01); *C09J 175/04* (2013.01); *H01L 21/566* (2013.01); *H01L 21/568* (2013.01); *H01L 23/293* (2013.01); *H01L 23/3107* (2013.01); *H01L 23/4334* (2013.01); *H01L 23/49537* (2013.01); *H01L 23/49551* (2013.01); *H01L 23/49575* (2013.01); *H01L 27/14* (2013.01); *C08G 2170/40* (2013.01); *C08K 2201/017* (2013.01); *C09J 2201/622* (2013.01); *C09J 2203/326* (2013.01); *C09J 2205/102* (2013.01); *C09J 2205/11* (2013.01); *C09J 2427/006* (2013.01); *C09J 2433/00* (2013.01); *C09J 2475/00* (2013.01); *H01L 2224/16227* (2013.01); *H01L 2224/16245* (2013.01); *H01L 2224/26145* (2013.01); *H01L 2224/26175* (2013.01); *H01L 2224/27013* (2013.01); *H01L 2224/2929* (2013.01); *H01L 2224/29101* (2013.01); *H01L 2224/29339* (2013.01); *H01L 2224/29499* (2013.01); *H01L 2224/40247* (2013.01); *H01L 2224/48091* (2013.01); *H01L 2224/48227* (2013.01); *H01L 2224/48247* (2013.01); *H01L 2224/83139* (2013.01); *H01L 2224/97* (2013.01); *H01L 2924/15311* (2013.01); *H01L 2924/18161* (2013.01)

(56) References Cited

FOREIGN PATENT DOCUMENTS

| | | |
|---|---|---|
| JP | 2004-79567 | 3/2004 |
| JP | 2004-253498 | 9/2004 |
| JP | 2005-166904 | 6/2005 |
| JP | 2009-200338 | 9/2009 |
| JP | 2012-167177 | 9/2012 |
| JP | 2014-225619 | 12/2014 |

* cited by examiner

FILM, METHOD FOR ITS PRODUCTION, AND METHOD FOR PRODUCING SEMICONDUCTOR ELEMENT USING THE FILM

TECHNICAL FIELD

The present invention relates to a film suitable as a mold release film for producing a semiconductor element, a method for its production, and a method for producing a semiconductor element using the film.

BACKGROUND ART

A semiconductor chip is usually accommodated (sealed) in a container called a package to be shielded and protected from outside air, and mounted on a substrate as a semiconductor element. For the package, a curable resin such as a thermosetting resin such as epoxy resin is used. As a method for producing a semiconductor element, for example, a so-called transfer molding or compression molding method is known wherein a semiconductor chip or the like is disposed so as to be positioned at a predetermined location in a mold, and a curable resin is filled into the mold and cured.

In recent years, in a semiconductor element, for the purpose of improving heat dissipation or thinning, for example, it has been in practice to expose a semiconductor chip or a source electrode bonded to a semiconductor chip (e.g. Patent Document 1). As such a semiconductor element, a sensor may typically be mentioned.

In recent years, as a CCD (Charge Coupled Device) image sensor, a CMOS (Complementary Metal Oxide Semiconductor) image sensor or the like, it has been common to employ a semiconductor element having a hollow structure in which a sealing glass is laminated via a rib member (spacer) on a substrate on which a semiconductor chip is mounted. In the production of such a semiconductor element, after laminating a sealing glass on the rib member, it is common to further seal the circumferential surface of the rib member and the sealing glass with a curable resin (e.g. Patent Document 2).

Such a semiconductor element (hereinafter referred to also as an "exposed element") having a part of a semiconductor chip or another site (such as a source electrode or a sealing glass) exposed, may be produced, for example, by pressing a mold to a portion to be exposed of the semiconductor chip or another site (hereinafter referred to also as an "exposed portion") and, in that state, filling and curing a curable resin.

However, in the production of an exposed element, leakage of the curable resin to the exposed portion (so-called burr) is often problematic. That is, the filled curable resin enters between the mold and the exposed portion and gets cured in that state, so that the surface of the exposed portion is likely to be thinly covered by the cured product. In order to reduce the leakage, if the clamping pressure of the mold is increased to strongly press the mold to the exposed portion, the exposed portion is likely to be dented or damaged, so that the semiconductor chip or another site will be broken. Therefore, it is necessary to let the exposed portion and the mold be in contact weakly with each other, whereby leakage is likely to occur. If such leakage occurs, it will be required to take a step of removing the cured product covering the exposed portion, whereby the productivity will be lowered.

As a countermeasure against such leakage, it has been proposed to use mold release films of the following (1) to (4).

(1) one comprising two layers i.e. a layer (layer A) providing releasability from a molded article and a layer (layer B) providing heat resistance against heating during molding (Patent Document 3).

(2) one comprising at least two layers i.e. a layer (layer A) providing releasability of a semiconductor element and a layer (layer B) providing heat resistance against heating during molding, at the time of resin molding a semiconductor element, wherein layer B is a polyamide resin (Patent Document 4).

(3) one made of a composite film comprising a substrate film and an auxiliary layer having a compression elastic modulus lower than the substrate film, and to be used so that the auxiliary layer faces the surface of a chip to be sealed (Patent Document 5).

(4) one having formed on a substrate sheet a cushion layer having releasability with respect to a molding resin and having a compression elastic modulus of from 15 to 300 MPa at 180° C. and a thickness of from 20 to 70 μm (Patent Document 6).

In the mold release film (1), for the layer A, an acrylic resin, polyisobutylene, a poly(4-methylpentene-1) resin or a syndiotactic polystyrene resin is used, and for the layer B, a poly(4-methylpentene-1) resin, biaxially stretched polyethylene terephthalate, a soft copolymerized polyethylene terephthalate resin, polyether sulfone or polyimide is used.

In the mold release film (2), for the layer A, an acrylic resin or a silicone resin is used.

In the mold release film (3), for the auxiliary layer, a fluororesin (polytetrafluoroethylene, etc.) or fluorine rubber is used, and for the substrate film, a polyimide film or an aluminum foil is used.

In the mold release film (4), for the cushion layer, silicone rubber is used, and for the substrate sheet, polyester is used.

PRIOR ART DOCUMENTS

Patent Documents

Patent Document 1: JP-A-2009-200338
Patent Document 2: JP-A-2014-225619
Patent Document 3: JP-A-2002-158242
Patent Document 4: JP-A-2004-079567
Patent Document 5: JP-A-2001-250838
Patent Document 6: JP-A-2004-253498

DISCLOSURE OF INVENTION

Technical Problem

The above mold release film (1) or (2) is insufficient in releasability against the curable resin after curing (the resin sealed portion). In the case of a sensor being a typical exposed element, the shape is complicated, and the contact area between the mold release film and the resin sealed portion is large, and therefore, it is desired that releasability against the resin sealed portion is better (the adhesion to the resin sealed portion is lower).

The mold release film (1), (3) or (4) is insufficient in low migration property. For example, contamination of a semiconductor chip of an exposed element leads to an appearance defect such as discoloration. Therefore, a mold release film is required not to contaminate a semiconductor chip. In the case of the mold release film (1), (3) or (4), in the sealing step, contamination is likely to occur due to migration to the semiconductor chip, of components contained in the layer (auxiliary layer, layer A, cushion layer) in contact with the semiconductor chip, or of decomposition products (e.g. various additives contained in rubber, reactive oligomers resulting from silicone, etc.). A similar problem is likely to occur also in the case of the source electrode and the sealing glass. In this specification, the nature whereby the materials (contaminants) causing contamination as described above are less likely to migrate to the semiconductor chip, source electrode or sealing glass, is referred to also as "low migration property".

Among the mold release films (1) and (2), one using an acrylic resin for the layer A is insufficient in peeling property against a semiconductor chip. Sealing of a semiconductor element is carried out usually at a high temperature of about 180° C. With the mold release film (1) or (2) using an acrylic resin for the layer A, adhesion of the layer A increases during the sealing process, and at the time of peeling the mold release film from the exposed portion of the semiconductor chip, a part or all of the layer A will be left as attached to the semiconductor chip, thus causing a problem of so-called adhesive residue. A similar problem is likely to occur also in the case of the source electrode or the sealing glass. In this specification, as mentioned above, easiness in peeling of the mold release film at the time of peeling the mold release film from the exposed portion of the semiconductor chip, source electrode or sealing glass, is referred to as "peeling property", and a case where peeling is easy, will be referred that the peeling property is excellent, and a case where peeling is difficult, will be referred that the peeling property is insufficient.

As described above, the mold release films (1) to (4) were not ones which are able to satisfy both the releasability against the resin sealed portion and the low migration property and peeling property against the semiconductor chip, source electrode or sealing glass, in the production of the semiconductor element having a part of the surface of the semiconductor chip, source electrode or sealing glass exposed.

An object of the present invention is to provide a film which is excellent in releasability against the resin sealed portion and excellent in low migration property and peeling property against the semiconductor chip, source electrode or sealing glass and which is thus suitable as a mold release film for the production of a semiconductor element having a part of the surface of a semiconductor chip, source electrode or sealing glass exposed, and a method for its production, as well as a method for producing a semiconductor element using such a film.

Solution to Problem

The present invention provides a film suitable as a mold release film for the production of a semiconductor element, a method for its production and a method for producing a semiconductor element using such a film, having the following constructions [1] to [15].

[1] A film comprising a substrate and an adhesive layer provided on one surface of the substrate, characterized in that the storage elastic modulus at 180° C. of the substrate is from 10 to 100 MPa, the adhesive layer is a reaction cured product of a composition for adhesive layer comprising an acrylic polymer having hydroxy groups, and a polyfunctional isocyanate compound, the total equivalent amount of hydroxy groups and carboxy groups in the acrylic polymer is at most 2,000 g/mol, in the composition for adhesive layer, $M_{COOH}/(M_{NCO}-M_{OH})$ is from 0 to 1.0, and $M_{NCO}/(M_{COOH}+M_{OH})$ is from 0.4 to 3.5 (wherein $M_{OH}$ is the number of moles $M_{OH}$ of hydroxy groups derived from the acrylic polymer, $M_{COOH}$ is the number of moles of carboxy groups derived from the acrylic polymer, and $M_{NCO}$ is the number of moles of isocyanate groups derived from the polyfunctional isocyanate compound).

[2] The film according to [1], wherein the mass average molecular weight of the acrylic polymer is from 100,000 to 1,200,000.

[3] The film according to [1] or [2], wherein the polyfunctional isocyanate compound has an isocyanurate ring.

[4] The film according to any one of [1] to [3], wherein the storage elastic modulus at 180° C. of the adhesive layer is from 2 to 20 MPa.

[5] The film according to any one of [1] to [4], wherein the insolubility degree of the adhesive layer obtainable by the following formula from the basis weight W1 (g/m$^2$) of the adhesive layer and the basis weight W2 (g/m$^2$) of the adhesive layer remaining after subjecting the film to the following dissolution test, is from 40 to 90%:

Insolubility degree (%)=($W2/W1$)×100

<Dissolution Test>

The film is immersed in methylene chloride at from 20 to 25° C. and stirred for one day; the film after completion of the stirring for one day is immersed and washed for 10 minutes in another methylene chloride at from 20 to 25° C.; and the film after the washing is vacuum-dried at 100° C. for two hours.

[6] The film according to any one of [1] to [5], wherein the substrate contains an ethylene-tetrafluoroethylene copolymer.

[7] The film according to any one of [1] to [6], wherein the thickness of the substrate is from 50 to 100 μm, and the thickness of the adhesive layer is from 0.5 to 15 μm.

[8] The film according to any one of [1] to [7], wherein the composition for adhesive layer further contains an antistatic agent.

[9] The film according to any one of [1] to [7], which has an antistatic layer between the substrate and the adhesive layer.

[10] The film according to any one of [1] to [9], which is a mold release film to be used in a sealing process for producing a semiconductor element sealed with a sealing resin.

[11] The film according to [10], wherein the semiconductor element sealed with a sealing resin, is a semiconductor element having a part of the surface of a semiconductor chip, a source electrode or a sealing glass exposed from the sealing resin.

[12] The film according to [10] or [11], which is a mold release film to be used so that when the curable resin is cured and formed into the sealing resin in a mold in the sealing process, the substrate-side surface of the mold release film is in contact with the mold inner surface, and the surface of the adhesive layer of the mold release film is in contact with a part of the surface of a semiconductor chip.

[13] The film according to any one of [1] to [9], which is a mold release film to be used in the following sealing process:

Sealing process: A sealing process comprising a step of disposing the mold release film on the surface of a mold to be in contact with a curable resin so that its substrate side surface is in contact with the mold surface, and disposing, in the mold, a structure having a semiconductor chip, and having, as necessary, a source electrode or a sealing glass, a step of clamping the mold so that the mold is, via the mold release film, in contact with the surface of the semiconductor chip, the source electrode or the sealing glass, a step of filling and curing a curable resin in the mold while clamping the mold, to form a resin sealed portion, thereby to obtain a sealed body having said structure and said resin sealed portion and having a part of the surface of the semiconductor chip, source electrode or sealing glass exposed, and a step of releasing the sealed body from the mold.

[14] A method for producing the film as defined in any one of [1] to [9], characterized by comprising a step of forming an adhesive layer by applying and drying a coating liquid for adhesive layer comprising the composition for adhesive layer and a liquid medium on one surface of a substrate.

[15] A method for producing a semiconductor element having a semiconductor chip and a resin sealed portion, and having, as necessary, a source electrode or a sealing glass, and having a part of the surface of the semiconductor chip, source electrode or sealing glass exposed, characterized by comprising a step of disposing the film as defined in any one of [1] to [9] on the surface of a mold to be in contact with a curable resin, so that its substrate side surface is in contact with the mold surface, and disposing, in the mold, a structure having a semiconductor chip and having, as necessary, a source electrode or a sealing glass, a step of clamping the mold, so that the mold is, via the mold release film, in contact with the surface of the semiconductor chip, electrode or sealing glass, a step of filling and curing a curable resin in the mold, while clamping the mold, to form a resin sealed portion, thereby to obtain a sealed body having said structure and said resin sealed portion, and having a part of the surface of the semiconductor chip, source electrode or sealing glass exposed, and a step of releasing the sealed body from the mold.

Advantageous Effects of Invention

The film of the present invention is excellent in releasability against the resin sealed portion and excellent in low migration property and peeling property against the semiconductor chip, source electrode or sealing glass, and is useful as a mold release film for producing a semiconductor element having a part of the surface of a semiconductor chip, a source electrode or a sealing glass exposed.

According to the method for producing a film of the present invention, it is possible to produce a film which is excellent in releasability against the resin sealed portion and excellent in low migration property and peeling property against the semiconductor chip, source electrode or sealing glass, and which is useful as a mold release film for producing a semiconductor element having a part of the surface of a semiconductor chip, a source electrode or a sealing glass exposed.

DESCRIPTION OF EMBODIMENTS

Figure 1:
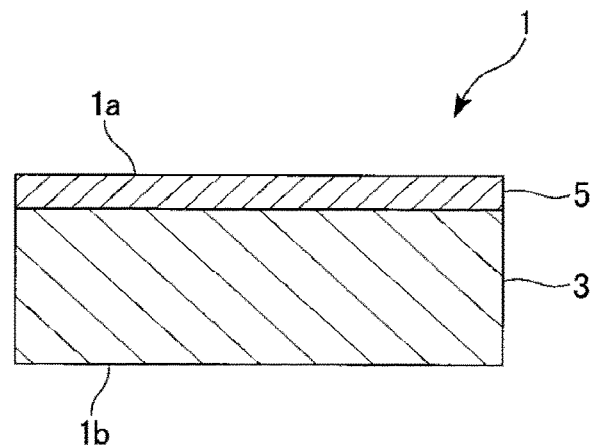
FIG. 1 is a schematic cross-sectional view showing a first embodiment of the film of the present invention.

In this specification, the meanings of the following terms are as follows.

The term "units" in a resin represents structural units (monomer units) constituting the resin. The units based on a monomer may sometimes be referred to as "monomer units".

An "acrylic polymer" is a polymer having units based on a (meth)acrylate. Units based on a (meth)acrylate contained in the acrylic polymer may be of one type or of two or more types. The acrylic polymer may further have other units other than units based on a (meth)acrylate.

A "(meth)acrylate" is a general term for an acrylate and a methacrylate. A "(meth)acrylic acid" is a general term for acrylic acid and methacrylic acid.

The "total equivalent amount of hydroxy groups and carboxy groups" in an acrylic polymer having hydroxy groups, means the mass per mole in total of hydroxy groups and carboxy groups in the acrylic polymer. In the following, the total equivalent amount will also be referred to as "crosslinkably functional group equivalent amount".

A "side group" refers to a group (pendant group) bonded to the main chain of the resin (polymer).

The film of the present invention is one suitable as a mold release film to be used in a sealing process for producing a semiconductor element sealed with a sealing resin. Hereinafter, the film to be used in this application will be referred to as a "mold release film".

The mold release film of the present invention is particularly suitable as a mold release film to be used in a sealing process for producing a semiconductor element having a part of the surface of a semiconductor chip, a source electrode or a sealing glass exposed from a sealing resin. However, its use is not limited thereto, and it may also be used in a sealing process for producing other resin-sealed semiconductor elements.

The mold release film of the present invention may be used so that at the time of curing a curable resin in a mold to form a sealing resin in the sealing process, the substrate side surface of the mold release film is in contact with the inner surface of the mold, and the surface of the adhesive layer of the mold release film is in contact with a part of the surface of the semiconductor chip. Thus, the sealing resin is not formed on the semiconductor chip surface which is in contact with the adhesive layer of the mold release film, and that surface becomes an exposed surface. Likewise, in a case where the mold release film of the present invention is to be used in a sealing process for producing a semiconductor element having a part of the surface of a source electrode or sealing glass of a semiconductor chip exposed from the sealing resin, the surface of the adhesive layer of the mold release film of the present invention is brought in contact with a part of the surface of the source electrode or sealing glass to prevent the contact between the surface and the curable resin, whereby the surface of the source electrode or sealing glass in contact with the surface of the adhesive layer of the mold release film can be made to be an exposed surface.

As a sealing process for producing a semiconductor element having a part of the surface of a semiconductor chip, a source electrode or a sealing glass exposed from the sealing resin, there may be mentioned a sealing process consisting of a combination of the following steps, although the sealing process is not limited thereto.

Sealing process: A sealing process comprising a step of disposing the mold release film on the surface of a mold to be in contact with a curable resin so that its substrate side surface is in contact with the mold surface, and disposing, in the mold, a structure having a semiconductor chip, and having, as necessary, a source electrode or a sealing glass; a step of clamping the mold so that the mold is, via the mold release film, in contact with the surface of the semiconductor chip, the source electrode or the sealing glass; a step of filling and curing a curable resin in the mold while clamping the mold, to form a resin sealed portion, thereby to obtain a sealed body having said structure and said resin sealed portion and having a part of the surface of the semiconductor chip, source electrode or sealing glass exposed; and a step of releasing the sealed body from the mold.

Now, with reference to a mold release film to be used in the above sealing process as an example, the details of the mold release film of the present invention will be described.

The mold release film of the present invention is, for example, at the time of forming a resin sealed portion of an exposed element, disposed to cover the surface (hereinafter referred to also as the "cavity surface") forming a cavity of a mold having the cavity (space) of a shape corresponding to the shape of the resin sealed portion, and disposed between the formed resin sealed portion and the mold cavity surface, whereby release of the obtained sealed body from the mold will be facilitated. Further, at the time of forming the resin sealed portion, it will be in close contact with a part of the surface of the semiconductor chip, source electrode or sealing glass, thereby to prevent entry of the curable resin into the part. The portion of the surface of the semiconductor chip, source electrode or sealing glass, with which the mold release film is in close contact, will be an exposed portion on the outer surface (surface in contact with the atmosphere) of the exposed element.

[Mold Release Film in First Embodiment]

FIG. 1 is a schematic cross-sectional view showing a first embodiment of the mold release film of the present invention.

The mold release film 1 in the first embodiment comprises a substrate 3 and an adhesive layer 5 provided on one side of the substrate 3.

The adhesive layer 5 is in contact with a curable resin and a semiconductor element during formation of a resin sealed portion. That is, at the time of producing a semiconductor package, the mold release film 1 is disposed so that the surface 1a of its adhesive layer 5 side faces a semiconductor chip, and will be in contact with the semiconductor chip, a source electrode or a seal glass and a curable resin at the time of forming a resin sealed portion. At that time, the surface 1b of its substrate 3 side is in close contact with the cavity surface of the mold. By curing the curable resin in this state, a resin sealed portion having a shape corresponding to the shape of the mold cavity will be formed. Further, the curable resin will not enter between the surface in contact with the surface 1a, of the semiconductor chip, source electrode or sealing glass, and the cavity surface, and said surface will be an exposed portion.

(Substrate)

The substrate 3 has a storage elastic modulus at 180° C. (hereinafter referred to also as a "storage elastic modulus (180° C.)") of from 10 to 100 MPa, particularly preferably from 10 to 80 MPa.

180° C. is a common mold temperature at the time of sealing a semiconductor element.

In the case of a sensor as a typical exposed element, the shape is complicated, and the shape of the cavity of a mold to be used in its production will also become complicated. When the storage elastic modulus (180° C.) is at most the upper limit value in the above range, the mold release film shows proper elongation under a high temperature condition, and even when the cavity surface has a complex shape as described above, the mold release film will certainly be in close contact with the cavity surface, whereby a resin sealed portion with high precision will be formed.

When the storage elastic modulus (180° C.) is at least the lower limit value in the above range, the mold release film exhibits a proper strength under a high temperature condition, and at the time of placing the mold release film so as to cover the cavity surface of the mold while pulling it under vacuum, a tear or pinhole is less likely to occur. Further, tension will be uniformly exerted to the mold release film, whereby wrinkles are less likely to be formed, and an appearance defect is less likely to occur due to transfer of wrinkles of the mold release film onto the surface of the resin sealed portion.

The storage elastic modulus (180° C.) is measured in accordance with ISO 6721-4, 1994 (JIS K7244-4, 1999). The frequency is set to be 10 Hz, the static force is set to be 0.98 N, and the dynamic displacement is set to be 0.035%. By raising the temperature from 20° C. at a rate of 2° C./min, the storage elastic modulus measured at a value of 180° C. is taken as the storage elastic modulus (180° C.).

The storage elastic modulus (180° C.) can be adjusted by e.g. the material (including the composition) constituting the substrate 3, etc. For example, in a case where the substrate 3 consists of a thermoplastic resin, the storage elastic modulus (180° C.) can be adjusted by adjusting the crystallinity of the thermoplastic resin. Specifically, the lower the crystallinity of the thermoplastic resin, the lower the storage elastic modulus (180° C.) becomes. The crystallinity of the thermoplastic resin can be adjusted by a known method. For example, in the case of an ethylene-tetrafluoroethylene copolymer (ETFE), it can be adjusted by the ratio of units based on tetrafluoroethylene and ethylene, the type or content of units based on other monomers other than tetrafluoroethylene and ethylene, etc.

As the substrate 3, from the viewpoint of excellent releasability of the mold release film from the mold after sealing, one containing a resin having mold releasability is preferred.

The resin having mold releasability means such a resin that a layer consisting solely of the resin has mold releasability. The resin having mold releasability is preferably one such that the storage elastic modulus (180° C.) of a layer consisting solely of that resin is in the above-mentioned range. Such a resin may, for example, be a fluororesin, polymethylpentene, syndiotactic polystyrene, polycycloolefin, silicone rubber, polyester elastomer, polybutylene terephthalate, non-stretched nylon, etc. From the viewpoint of releasability from the mold, heat resistance at a temperature (for example 180° C.) of the mold at the time of sealing, strength to withstand the flow or pressure of the curable resin, elongation at a high temperature, etc., a fluororesin, polymethylpentene, syndiotactic polystyrene, polycycloolefin or the like is preferred, and from the viewpoint of excellent mold releasability, a fluororesin is particularly preferred. These resins may be used alone or in combination of two or more of them.

As the substrate 3, one made solely of a fluororesin is preferred.

As the fluororesin, from the viewpoint of excellent mold releasability and heat resistance, a fluoroolefin polymer is preferred. A fluoroolefin polymer is a polymer having units based on a fluoroolefin. The fluoroolefin polymer may further have other units other than units based on a fluoroolefin.

The fluoroolefin may, for example, be tetrafluoroethylene (hereinafter referred to also as "TFE"), vinyl fluoride, vinylidene fluoride, trifluoroethylene, hexafluoropropylene, chlorotrifluoroethylene, etc. One of fluoroolefins may be used alone, or two or more of them may be used in combination.

The fluoroolefin polymer may, for example, be ETFE, a tetrafluoroethylene-hexafluoropropylene copolymer (FEP), a tetrafluoroethylene-perfluoro(alkyl vinyl ether) copolymer (PFA), a tetrafluoroethylene-hexafluoropropylene-vinylidene fluoride copolymer (THV), etc. One of fluoroolefin polymers may be used alone, or two or more of them may be used in combination.

As the fluoroolefin polymer, from the viewpoint of large elongation at a high temperature, ETFE is particularly preferred. ETFE is a copolymer having TFE units and ethylene units (hereinafter referred to also as "E units").

ETFE is preferably a polymer having TFE units, E units and units based on a third monomer other than TFE and ethylene. It is easy to adjust the crystallinity of ETFE as well as the storage elastic modulus (180° C.) or other tensile properties of the substrate 3 by the type or content of units based on the third monomer. For example, by having units based on the third monomer (particularly a monomer having fluorine atoms), the tensile strength and elongation at a high temperatures (particularly around 180° C.) will be improved.

As the third monomer, a monomer having fluorine atoms, and a monomer having no fluorine atom may be mentioned.

As the monomer having fluorine atoms, the following monomers (a1) to (a5) may be mentioned.

Monomer (a1): a fluoroolefin having 2 or 3 carbon atoms.

Monomer (a2): a fluoroalkyl ethylene represented by $X(CF_2)_nCY=CH_2$ (wherein X and Y are each independently a hydrogen atom or a fluorine atom, and n is an integer of from 2 to 8).

Monomer (a3): a fluoro vinyl ether.

Monomer (a4): a functional group-containing fluoro vinyl ether.

Monomer (a5): a fluorinated monomer having an aliphatic ring structure.

The monomer (a1) may, for example, be a fluoro ethylene (trifluoroethylene, vinylidene fluoride, vinyl fluoride, chlorotrifluoroethylene, etc.), a fluoropropylene (hexafluoropropylene (hereinafter referred to also as "HFP"), 2-hydropentafluoropropylene, etc.), etc.

As the monomer (a2), a monomer wherein n is from 2 to 6, is preferred, and a monomer wherein n is 2 to 4, is particularly preferred. Further, a monomer wherein X is a fluorine atom, and Y is a hydrogen atom, i.e. a (perfluoroalkyl) ethylene, is particularly preferred.

As specific examples of the monomer (a2), the following compounds may be mentioned.
$CF_3CF_2CH=CH_2$
$CF_3CF_2CF_2CF_2CH=CH_2$ ((perfluorobutyl) ethylene, hereinafter referred to also as "PFBE"),
$CF_3CF_2CF_2CF_2CF=CH_2$,
$CF_2HCF_2CF_2CF=CH_2$,
$CF_2HCF_2CF_2CF_2CF=CH_2$, etc.

As specific examples of the monomer (a3), the following compounds may be mentioned. Here, among the following, a monomer which is a diene, is a monomer which can be cyclo-polymerizable.
$CF_2=CFOCF_3$,
$CF_2=CFOCF_2CF_3$,
$CF_2=CF(CF_2)_2CF_3$ (perfluoro(propyl vinyl ether), hereinafter referred to also as "PPVE"),
$CF_2=CFOCF_2CF(CF_3)O(CF_2)_2CF_3$,
$CF_2=CFO(CF_2)_3O(CF_2)_2CF_3$,
$CF_2=CFO(CF_2CF(CF_3)O)_2(CF_2)_2CF_3$,
$CF_2=CFOCF_2CF(CF_3)O(CF_2)_2CF_3$,
$CF_2=CFOCF_2CF=CF_2$,
$CF_2=CFO(CF_2)_2CF=CF_2$, etc.

As specific examples of the monomer (a4), the following compounds may be mentioned.
$CF_2=CFO(CF_2)_3CO_2CH_3$,
$CF_2=CFOCF_2CF(CF_3)O(CF_2)_3CO_2CH_3$,
$CF_2=CFOCF_2CF(CF_3)O(CF_2)_2SO_2F$, etc.

Specific examples of the monomer (a5) may, for example, be perfluoro(2,2-dimethyl-1,3-dioxole), 2,2,4-trifluoro-5-trifluoromethoxy-1,3-dioxole, perfluoro(2-methylene-4-methyl-1,3-dioxolane), etc.

As monomers having no fluorine atom, the following monomers (b1) to (b4) may be mentioned.
Monomer (b1): an olefin,
Monomer (b2): a vinyl ester,
Monomer (b3): a vinyl ether,
Monomer (b4): an unsaturated acid anhydride.

Specific examples of the monomer (b1) may, for example, be propylene, isobutene etc.

Specific examples of the monomer (b2) may, for example, be vinyl acetate, etc.

Specific examples of the monomer (b3) may, for example, be ethyl vinyl ether, butyl vinyl ether, cyclohexyl vinyl ether, hydroxybutyl vinyl ether, etc.

Specific examples of the monomer (b4) may, for example, be maleic anhydride, itaconic anhydride, citraconic anhydride, 5-norbornene-2,3-dicarboxylic acid anhydride, etc.

As the third monomer, one type may be used alone, or two or more types may be used in combination.

As the third monomer, from such a viewpoint that crystallinity can easily be adjusted, and tensile strength and elongation at a high temperature (particularly around 180° C.) will be excellent by having units based on a third monomer (particularly a monomer having fluorine atoms), the monomer (a2), HFP, PPVE or vinyl acetate is preferred; HFP, PPVE, $CF_3CF_2CH=CH_2$ or PFBE is more preferred; and PFBE is particularly preferred. That is, as ETFE, a copolymer having units based on TFE, units based on E and units based on PFBE, is particularly preferred.

In ETFE, the molar ratio of TFE unit to E units (TFE units/E units) is preferably from 80/20 to 40/60, more preferably from 70/30 to 45/55, particularly preferably from 65/35 to 50/50. When TFE units/E units is within the above range, heat resistance and mechanical strength of the ETFE will be excellent.

The proportion of the units based on the third monomer in ETFE is preferably from 0.01 to 20 mol %, more preferably from 0.10 to 15 mol %, particularly preferably from 0.20 to 10 mol %, to the total (100 mol %) of all units constituting ETFE. When the proportion of the units based on the third monomer is within the above range, heat resistance and mechanical strength of ETFE will be excellent.

In a case where the units based on the third monomer include PFBE units, the proportion of PFBE units is preferably from 0.5 to 4.0 mol %, more preferably from 0.7 to 3.6 mol %, particularly preferably from 1.0 to 3.6 mol %, to the total (100 mol %) of all units constituting ETFE. When the proportion of PFBE units is within the above range, the tensile elastic modulus at 180° C. of the mold release film can be adjusted in the above-mentioned range. Further, the tensile strength and elongation at a high temperature (particularly around 180° C.) will be improved.

The melt flow rate (MFR) of ETFE is preferably from 2 to 40 g/10 min, more preferably from 5 to 30 g/10 min, particularly preferably from 10 to 20 g/10 min. MFR is an index for the molecular weight, and the larger the MFR, the smaller the molecular weight tends to be. When MFR of ETFE is within the above range, the moldability of ETFE will be improved, and the mechanical strength of the mold release film will be excellent.

MFR of ETFE is a value measured under a load of 49 N at 297° C. in accordance with ASTM D3159.

The substrate 3 may be made solely of a mold releasable resin or may contain, in addition to a releasable resin, components other than the releasing resin.

Such other components may, for example, be a lubricant, an anti-oxidant, an antistatic agent, a plasticizer, a mold release agent, etc.

The substrate 3 should better not contain other components with a view to not contaminating the mold.

The surface of the substrate 3 to be in contact with the mold at the time of forming a resin sealed portion, i.e. the substrate 3 side surface 1b of the mold release film 1, may be smooth or may have irregularities formed thereon. From the viewpoint of excellent releasability from the mold, it is preferably one having irregularities formed thereon.

The surface shape when irregularities are formed may be a shape in which a plurality of protrusions and/or recesses are randomly distributed, or a plurality of protrusions and/or recesses are regularly arranged. The shapes and sizes of the plurality of protrusions and/or recesses may be the same or different.

The protrusions may be elongate ridges extending on the surface of the mold release film, or projections scattered on the surface, and the recesses may be elongate grooves extending on the surface of the mold release film, or holes scattered on the surface.

The shape of the ridges or grooves may, for example, be lines, curves or bent shape. On the mold release film surface, a plurality of ridges or grooves may be present in parallel to form stripes. Of ridges or grooves, the cross-sectional shape in a direction perpendicular to the longitudinal direction may, for example, be a polygonal shape such as triangular (V-shaped), semicircular, etc.

The shape of the protrusions or holes may, for example, be a polygonal pyramid shape such as a triangular pyramid shape, a tetragonal pyramid shape, a hexagonal pyramid shape, etc., a conical shape, a hemispherical shape, a polyhedral shape, other various irregular shapes, etc.

The arithmetic average roughness Ra of the surface 1b is preferably from 0.2 to 2.5 µm, particularly preferably from 0.2 to 2.0 µm. When the arithmetic average roughness Ra of the surface 1b is at least the lower limit value in the above range, releasability from the mold will be better. Further, the surface 1b and the mold are less likely to cause blocking, and wrinkles due to the blocking are less likely to be formed. When the arithmetic average roughness Ra of the surface 1b is at most the upper limit value in the above range, pinholes are less likely to be formed in the mold release film.

The arithmetic average roughness Ra is a value measured in accordance with JIS B0601; 2013 (ISO 4287; 1997, Amd. 1; 2009). The standard length lr (cut-off value λc) for a roughness curve is 0.8 mm.

The thickness of the substrate 3 is preferably from 50 to 100 µm, particularly preferably from 50 to 75 µm. When the thickness of the substrate 3 is at most the upper limit value in the above range, the mold release film 1 can be easily deformed and thus is excellent in mold followability. When the thickness of the substrate 3 is at least the lower limit value in the above range, the handling of the mold release film 1 (e.g. treatment by roll-to-roll) will be easy, and wrinkles will be less likely to be formed at the time of disposing the mold release film 1 to cover the cavity of a mold while pulling it.

(Adhesive Layer)

The adhesive layer 5 is a reaction cured product of a composition for adhesive layer comprising a hydroxy group-containing acrylic polymer and a polyfunctional isocyanate compound. The hydroxy group-containing acrylic polymer is reacted, crosslinked and cured with a polyfunctional isocyanate compound, to form the reaction cured product.

The composition for adhesive layer may further optionally contain, in a range not to impair the effects of the present invention, components other than the acrylic polymer and the polyfunctional isocyanate compound (excluding a liquid medium).

<Hydroxy Group-Containing Acrylic Polymer>

Hydroxy groups in the hydroxy group-containing acrylic polymer are crosslinkably functional groups reactive with isocyanate groups of the polyfunctional isocyanate compound.

The hydroxy value of the hydroxy group-containing acrylic polymer is preferably from 1 to 100 mgKOH/g, particularly preferably from 29 to 100 mgKOH/g.

The hydroxy value is measured by the method specified in JIS K0070; 1992.

The hydroxy group-containing acrylic polymer may or may not have carboxy groups. The carboxy groups are, like the hydroxy groups, crosslinkably functional groups reactive with isocyanate groups of the polyfunctional isocyanate compound.

The acid value of the hydroxy group-containing acrylic polymer is preferably from 0 to 100 mgKOH/g, particularly preferably from 0 to 30 mgKOH/g.

The acid value is, like the hydroxy value, measured by the method specified in JIS K0070; 1992.

The crosslinkably functional group equivalent amount of the hydroxy group-containing acrylic polymer (the total equivalent amount of hydroxy groups and carboxy groups) is at most 2,000 g/mol, preferably from 500 to 2,000 g/mol, particularly preferably from 1,000 to 2,000 g/mol.

The crosslinkably functional group equivalent amount corresponds to the molecular weight between crosslinking sites, and is a physical property value which governs the elastic modulus after crosslinking (the elastic modulus of the reaction cured product). When the crosslinkably functional group equivalent amount is at most the upper limit value in the above range, the elastic modulus of the reaction cured product becomes sufficiently high, and the releasability of the adhesive layer 5 against the resin sealed portion, and the peeling property against the semiconductor chip, source electrode or sealing glass, will be excellent. Further, the low migration property will be excellent.

In the hydroxy group-containing acrylic polymer, hydroxy groups may be present in side groups or may be present in the main chain terminals, or may be present in both of them. With a view to easily adjusting the content of hydroxy groups, they are preferably present at least in the side groups.

As a hydroxyl group-containing acrylic polymer wherein hydroxy groups are present in side groups, a copolymer having the following unit (c1) and the following unit (c2) is preferred.

Unit (c1): a (meth)acrylate unit having a hydroxy group.
Unit (c2): a unit other than unit (c1).

As unit (c1), the following unit may, for example, be mentioned.

In unit (c1), $R^1$ is a hydrogen atom or a methyl group, $R^2$ is a $C_{2-10}$ alkylene group or a $C_{3-10}$ cycloalkylene group or $-R^3-OCO-R^5-COO-R^4-$. $R^3$ and $R^4$ are each independently a $C_{2-10}$ alkylene group, and $R^5$ is a phenylene group.

$R^1$ is preferably a hydrogen atom.

The alkylene groups for $R^2$, $R^3$ and $R^4$ may be linear or branched.

Specific examples of a monomer to constitute unit (c1) may be 2-hydroxyethyl acrylate, 2-hydroxyethyl methacrylate, 2-hydroxypropyl acrylate, 2-hydroxypropyl methacrylate, 4-hydroxybutyl acrylate, 2-hydroxybutyl acrylate, 1,4-cyclohexanedimethanol monoacrylate, 2-acryloyloxyethyl-2-hydroxyethyl-phthalic acid, etc. One of these may be used alone, or two or more of them may be used in combination.

As unit (c1), from the viewpoint of excellent reactivity of the hydroxy group, one wherein $R^2$ is a $C_{2-10}$ alkylene group is preferred. That is, a hydroxyalkyl (meth)acrylate unit having a $C_{2-10}$ hydroxyalkyl group is preferred.

The proportion of units (c1) to the total (100 mol %) of all units constituting the hydroxy group-containing acrylic polymer is preferably from 3 to 30 mol %, particularly preferably from 3 to 20 mol %. When the proportion of units (c1) is at least the lower limit value in the above range, the crosslinking density due to the polyfunctional isocyanate compound will be sufficiently high, and the releasability of the adhesive layer 5 against the resin sealed portion, and the peeling property against the semiconductor chip, source electrode or sealing glass will be better. When the proportion of units (c1) is at most the upper limit value in the above range, the adhesion to the semiconductor chip, source electrode or seal glass will be better.

Unit (c2) is not particularly limited so long as it is copolymerizable with a monomer to constitute unit (c1). Unit (c2) may have a carboxy group, but preferably does not have a reactive group (e.g. an amino group) capable of reacting with an isocyanate group, other than a carboxy group.

A monomer to constitute unit (c2) may, for example, be a (meth)acrylate having no hydroxy group, (meth)acrylic acid, acrylonitrile or a macromer having an unsaturated double bond. The macromer having an unsaturated double bond may, for example, be a macromer having a polyoxyalkylene chain, such as a (meth)acrylate of a polyethylene glycol monoalkyl ether.

The (meth)acrylate having no hydroxy group may, for example, be an alkyl (meth)acrylate, cyclohexyl (meth) acrylate, phenyl (meth)acrylate, toluyl (meth)acrylate, benzyl (meth)acrylate, 2-methoxyethyl (meth)acrylate, 3-methoxybutyl (meth)acrylate, glycidyl (meth)acrylate, 2-aminoethyl (meth)acrylate, 3-(methacryloyloxypropyl) trimethoxysilane, trifluoromethyl methyl (meth)acrylate, 2-trifluoromethyl ethyl (meth)acrylate, 2-perfluoroethyl ethyl (meth)acrylate, 2-perfluoroethyl-2-perfluorobutyl ethyl (meth)acrylate, 2-perfluoroethyl (meth)acrylate, perfluoromethyl (meth)acrylate, diperfluoromethyl methyl (meth)acrylate, 2-perfluoromethyl-2-perfluoroethyl methyl (meth)acrylate, 2-perfluorohexylethyl (meth)acrylate, 2-perfluoro-decylethyl (meth)acrylate, 2-perfluoro-hexadecylethyl (meth)acrylate, etc.

The alkyl (meth)acrylate is preferably a compound having from 1 to 12 carbon atoms in the alkyl group, such as methyl (meth)acrylate, ethyl (meth)acrylate, butyl (meth)acrylate, 2-ethylhexyl (meth)acrylate, n-propyl (meth)acrylate, isopropyl (meth)acrylate, isobutyl (meth)acrylate, t-butyl (meth)acrylate, n-pentyl (meth)acrylate, n-hexyl (meth) acrylate, n-heptyl (meth)acrylate, n-octyl (meth)acrylate, nonyl (meth)acrylate, decyl (meth)acrylate, dodecyl (meth) acrylate, etc.

Unit (c2) preferably contains at least an alkyl (meth) acrylate unit.

The proportion of alkyl (meth)acrylate units to the total (100 mol %) of all units constituting the hydroxy group-containing acrylic polymer is preferably from 70 to 97 mol %, particularly preferably from 60 to 97 mol %. When the proportion of alkyl (meth)acrylate units is at least the lower limit value in the above range, a glass transition point or mechanical properties derived from the structure of the alkyl (meth)acrylate will be exhibited, and the adhesive layer 5 will be excellent in mechanical strength and adhesive properties. When the proportion of alkyl acrylate units is at most the upper limit value in the above range, the content of hydroxy groups will be sufficient, whereby the crosslinking density will be increased, and the predetermined elastic modulus will be attained.

The mass average molecular weight (Mw) of the hydroxy group-containing acrylic polymer is preferably from 100,000 to 1,200,000, more preferably from 200,000 to 1,000,000, particularly preferably from 200,000 to 700,000. When the mass average molecular weight is at least the lower limit value in the above range, releasability against the resin sealed portion, and the peeling property against the semiconductor chip, source electrode or sealing glass, will be better. When the mass average molecular weight is at most the upper limit value in the above range, the adhesion to the semiconductor chip, source electrode or seal glass will be better.

The mass average molecular weight of a hydroxy group-containing acrylic polymer is a value calculated as polystyrene, obtainable by measuring by gel permeation chromatography, by using a calibration curve prepared by using a standard polystyrene sample having a known molecular weight.

The glass transition temperature (Tg) of the hydroxy group-containing acrylic polymer is preferably at most 20° C., particularly preferably at most 0° C. When Tg is at least the lower limit value in the above range, even if the temperature becomes low, the adhesive layer will exhibit sufficient flexibility, and it will be easy to peel the substrate 3.

The lower limit of Tg is not particularly limited, but within the above-mentioned molecular weight range, it is preferably at least −60° C.

In this specification, Tg means the midpoint glass transition temperature measured by a differential scanning calorimetry (DSC) method.

<Polyfunctional Isocyanate Compound>

A polyfunctional isocyanate compound is a compound having at least two isocyanate groups, preferably a compound having from 3 to 10 isocyanate groups.

The polyfunctional isocyanate compound may, for example, be hexamethylene diisocyanate (HDI), tolylene diisocyanate (TDI), diphenylmethane diisocyanate (MDI), naphthalene diisocyanate (NDI), tolidine diisocyanate (TODI), isophorone diisocyanate (IPDI), xylene diisocyanate (XDI), triphenylmethane triisocyanate, tris(isocyanate phenyl) thiophosphate, etc. Further, an isocyanurate (trimer) or biuret of such a polyfunctional isocyanate compound, or an adduct of such a polyfunctional isocyanate compound and a polyol compound may also be mentioned.

The polyfunctional isocyanate compound preferably has an isocyanurate ring, since due to the planarity of the ring structure, the reaction cured product (adhesive layer) shows a high modulus of elasticity.

The polyfunctional isocyanate compound having an isocyanurate ring may, for example, be an isocyanurate of HDI (isocyanurate type HDI), an isocyanurate of TDI (isocyanurate type TDI), an isocyanurate of MDI (isocyanurate type MDI), etc.

<Other Components>

Other components which may optionally be contained as the case requires in the composition for adhesive layer, may, for example, be a crosslinking catalyst (e.g. an amine, a metal compound, an acid, etc.), a reinforcing filler, a coloring dye, a pigment, an antistatic agent, etc.

The crosslinking catalyst may be any substance that functions as a catalyst for the reaction (urethanization reaction) of the hydroxy group-containing acrylic copolymer with a crosslinking agent in the case of using the polyfunctional isocyanate compound as the crosslinking agent, and a common urethanization reaction catalyst may be used. For example, an amine-type compound such as a tertiary amine, etc., an organometallic compound such as an organotin compound, an organic lead compound, an organic zinc compound, etc. may be mentioned. The tertiary amine may, for example, be a trialkyl amine, an N,N,N',N'-tetraalkyl diamine, an N,N-dialkylamino alcohol, triethylenediamine, a morpholine derivative, a piperazine derivative, etc. The organotin compound may, for example, be a dialkyltin oxide, a fatty acid salt of a dialkyltin, a stannous fatty acid salt, etc.

As the crosslinking catalyst, an organotin compound is preferred, and dioctyltin oxide, dioctyltin dilaurate, dibutyltin laurate, or dibutyltin dilaurate is particularly preferred. Further, a dialkyl acetylacetone tin complex catalyst can also be used which is synthesized by reacting a dialkyltin ester and acetylacetone in a solvent, and which has a structure wherein 2 molecules of acetylacetone are coordinated to 1 atom of a dialkyltin.

The amount of the crosslinking catalyst to be used, is preferably from 0.01 to 0.5 part by mass to 100 parts by mass of the hydroxy group-containing acrylic polymer.

The antistatic agent may, for example, be an ionic liquid, a conductive polymer, a metal ion conductive salt, a conductive metal oxide, etc.

The conductive polymer is a polymer wherein electrons move and diffuse along the polymer skeleton (polymer backbone). The conductive polymer may, for example, be a polyaniline-type polymer, a polyacetylene-type polymer, a polyparaphenylene-type polymer, a polypyrrole-type polymer, a polythiophene-type polymer, a polyvinyl carbazole-type polymer, etc.

The metal ion-conductive salt may, for example, be a lithium salt compound, etc.

The conductive metal oxide may, for example, be tin oxide, tin-doped indium oxide, antimony-doped tin oxide, phosphorus-doped tin oxide, zinc antimonate, antimony oxide, etc.

The content of the antistatic agent in the composition for adhesive layer is suitably set depending on the desired surface resistivity of the adhesive layer 5.

In the composition for adhesive layer, the respective contents of the hydroxy group-containing acrylic polymer and the polyfunctional isocyanate compound are set depending on the respective amounts of hydroxy groups, carboxy groups and isocyanate groups so that $M_{COOH}/(M_{NCO}-M_{OH})$ would be from 0 to 1.0, and $M_{NCO}/(M_{COOH}+M_{OH})$ would be from 0.4 to 3.5.

$M_{COOH}/(M_{NCO}-M_{OH})$ is preferably from 0 to 1.0, particularly preferably from 0 to 0.5.

$M_{NCO}/(M_{COOH}+M_{OH})$ is preferably from 0.4 to 4.0, particularly preferably from 0.4 to 3.0.

Here, $M_{OH}$ is the number of moles $M_{OH}$ of hydroxy groups derived from the hydroxy group-containing acrylic polymer, $M_{COOH}$ is the number of moles of carboxy groups derived from the hydroxy group-containing acrylic polymer, and $M_{NCO}$ is the number of moles of isocyanate groups derived from the polyfunctional isocyanate compound.

$M_{COOH}/(M_{NCO}-M_{OH})$ is a ratio of the number of moles of carboxyl groups to the number of moles of isocyanate groups which do not react with hydroxy groups, among the isocyanate groups of the polyfunctional isocyanate compound contained in the composition for adhesive layer. That is, the smaller the $M_{COOH}/(M_{NCO}-M_{OH})$ is, the less the free carboxy groups remaining in the adhesive layer 5 being the reaction cured product of the composition for adhesive layer, becomes. If free carboxy groups are contained in the adhesive layer 5, they are likely to react with a curable resin, e.g. an epoxy resin, whereby peeling tends to be difficult. When $M_{COOH}/(M_{NCO}-M_{OH})$ is at most 1.0, free carboxy groups in the adhesive layer 5 will be sufficiently less, and releasability against the resin sealed portion will be excellent.

$M_{NCO}/(M_{COOH}+M_{OH})$ is a ratio of the number of moles of isocyanate groups of the polyfunctional isocyanate compound to the number of moles in total of hydroxyl groups and carboxyl groups (i.e. crosslinkably functional groups) of the hydroxy group-containing acrylic polymer contained in the composition for adhesive layer. When $M_{NCO}/(M_{COOH}+M_{OH})$ is at least the lower limit value in the above range, the crosslinking density, thus the elastic modulus, of the reaction cured product will be sufficiently high, and the releasability of the adhesive layer 5 against the resin sealed portion, and the peeling property of the adhesive layer 5 against the semiconductor chip, source electrode or sealing glass will be excellent. When $M_{NCO}/(M_{COOH}+M_{OH})$ is at most the upper limit value in the above range, the elastic modulus of the adhesive layer 5 will not be too high, and the adhesion to the semiconductor chip, source electrode or sealing glass will be excellent. Further, the amount of the polyfunctional isocyanate compound remaining as unreacted in the adhesive layer 5 will be small, and the low migration property against the semiconductor chip, source electrode or sealing glass will be excellent.

The total content of the hydroxy group-containing acrylic polymer and the polyfunctional isocyanate compound in the composition for adhesive layer is preferably at least 50 mass % to the total amount of the composition for adhesive layer. The adhesive layer 5 is a layer formed from the composition for adhesive layer and can be formed by reacting the hydroxy group-containing acrylic polymer and the polyfunctional isocyanate compound.

As a method for forming the adhesive layer 5, from such a viewpoint that materials contained in the composition for adhesive layer will be uniformly mixed, so that a uniform adhesive layer will be obtained, and it is possible to obtain an adhesive layer having any optional thickness or width, preferred is a method wherein the composition for adhesive layer and a liquid medium are preliminarily mixed, and the coating liquid for adhesive layer thereby obtained is applied on one surface of the substrate 3, followed by drying. Such a method will be described later in detail.

The storage elastic modulus (180° C.) of the adhesive layer 5 is preferably from 2 to 20 MPa. When the storage elastic modulus (180° C.) of the adhesive layer 5 is at least the lower limit value in the above range, the releasability against the resin sealed portion, and the peeling property against the semiconductor chip, source electrode or sealing glass will be better. When the storage elastic modulus (180° C.) of the adhesive layer 5 is at most the upper limit value in the above range, the adhesion to the semiconductor chip, source electrode or sealing glass will be better, and the effect to prevent leakage of the curable resin to the exposed portion will be better.

The storage elastic modulus (180° C.) of the adhesive layer 5 may be adjusted by $M_{COOH}/(M_{NCO}-M_{OH})$, $M_{NCO}/(M_{COOH}+M_{OH})$, the type of the polyfunctional isocyanate compound, the mixing ratio of the hydroxy group-containing acrylic polymer and the polyfunctional isocyanate compound, etc.

The insolubility degree of the adhesive layer 5 is preferably from 40 to 90%, particularly preferably from 50 to 90%. The insolubility degree of the adhesive layer 5 is an index for the crosslinking density of the hydroxy group-containing acrylic polymer. The higher the crosslinking density of the hydroxy group-containing acrylic polymer is, the higher the insolubility degree tends to become. When the insolubility degree is at least the lower limit value in the above range, the releasability against the resin sealed portion, and the peeling property against the semiconductor chip, source electrode or sealing glass will be better. When the insolubility degree is at most the upper limit value in the above range, the adhesion to the semiconductor chip, source electrode or sealing glass will be better.

The insolubility degree of the adhesive layer 5 is obtainable by the following formula from the basis weight W1 (g/m$^2$) of the adhesive layer 5 and the basis weight W2 (g/m$^2$) of the adhesive layer 5 remaining after subjecting the mold release film 1 to the following dissolution test:

Insolubility Degree (%)=(W2/W1)×100

<Dissolution Test>

The mold release film is immersed in methylene chloride at from 20 to 25° C. and stirred for 1 day. The mold release film after completion of stirring for 1 day, is immersed and washed for 10 minutes in another methylene chloride for from 20 to 25° C. The mold release film after the washing, is vacuum-dried at 100° C. for two hours.

The insolubility degree of the adhesive layer 5 may be adjusted by $M_{NCO}/(M_{COOH}+M_{OH})$, the type of the polyfunctional isocyanate compound, the temperature at the time of reacting the hydroxy group-containing acrylic polymer and the polyfunctional isocyanate compound, etc.

The surface resistance of the adhesive layer 5 is preferably at most $10^{10}$Ω/□ more preferably $10^9$Ω/□. When the surface resistance is at most $10^{10}$Ω/□, it is possible to effectively prevent breakage of a semiconductor chip due to discharge during the peeling.

The surface of the adhesive layer 5 in contact with a curable resin at the time of forming a resin sealed portion, i.e. the surface 1a of the adhesive layer 5 side of the mold release film 1, may be smooth or may have irregularities formed thereon.

The arithmetic average roughness Ra of the surface 1a is preferably from 0.05 to 2.5 μm, more preferably from 0.05 to 2.0 μm, particularly preferably from 0.05 to 0.5 μm. When the arithmetic average roughness Ra of the surface 1a is at least the lower limit value in the above range, the resin flow marks (flow marks) at the resin sealed portion formed will not be distinct. When the arithmetic average roughness Ra of the surface 1a is at most the upper limit value in the above range, adhesion between the surface 1a and the semiconductor element or a component associated therewith will be excellent. Further, the visibility of marking applied to the resin sealed portion after the formation of the resin sealed portion, will be better.

The thickness of the adhesive layer 5 is preferably from 0.5 to 15 μm, particularly preferably from 1 to 10 μm. When the thickness of the adhesive layer 5 is at least the lower limit value in the above range, the adhesion to the semiconductor chip, source electrode or sealing glass will be better. When the thickness of the adhesive layer 5 is at most the upper limit value in the above range, the releasability against the resin sealed portion will be better.

(Physical Properties of Mold Release Film)

The mold release film 1 preferably satisfies, for example, the following conditions i) to iii).

i) The peeling force at 180° C. of the epoxy resin obtainable by the following test method (hereinafter referred to also as the "peeling force (180° C.) of the epoxy resin") is from 0.001 to 0.1 N/cm.

ii) The adhesive force at 180° C. obtainable by the following test method (hereinafter referred to also as the "adhesive force (180° C.)") is from 0.005 to 0.1 N/24 mm.

iii) The migration property obtainable by the following test method (Al element peak intensity after pressing/Al element peak intensity before pressing) is from 0.6 to 1.

The peeling force (180° C.) of the epoxy resin in i) is an index for the releasability against the resin sealed portion, and the smaller the value, the better the releasability. The peeling force (180° C.) of the epoxy resin is preferably from 0.001 to 0.05 N/cm.

The adhesive force (180° C.) in ii) is an index for the adhesive force against the semiconductor chip, source electrode or sealing glass. When the adhesive force (180° C.) is at least the above lower limit value, it is possible to sufficiently reduce leakage of a resin to the exposed portion on the surface of the semiconductor chip, source electrode or sealing glass. When the adhesive force (180° C.) is at most the upper limit value in the above range, the peeling property against the semiconductor chip, source electrode or sealing glass will be excellent. The adhesive force (180° C.) is preferably from 0.005 to 0.05 N/24 mm.

The Al element peak intensity after pressing/Al element peak intensity before pressing in iii) is an index for the migration property against the semiconductor element, and the maximum is 1. The closer the value to 1, the lower the migration property. The lower the migration property, the better the appearance of the exposed portion of the surface of the semiconductor chip, source electrode or sealing glass.

For example, discoloration of the semiconductor chip surface after solder reflow will be suppressed.

<Peeling Force (180° C.) of Epoxy Resin>

On a square first metal plate (SUS304) having a thickness of 3 mm and a size of 15 cm×15 cm, a square aluminum foil having a thickness of 100 μm and a size of 15 cm×15 cm is placed; on the aluminum foil, a square spacer having a thickness of 100 mm and a size of 15 cm×15 cm and having a rectangular hole of 10 cm×8 cm formed at its center, is placed; in the vicinity of the center of the hole, 2 g of the following epoxy resin composition is placed; further thereon, a square mold release film having a size of 15 cm×15 cm is placed so that the surface of the adhesive layer side faces the above spacer side; and thereon, a square second metal plate (SUS304) having a thickness of 3 mm and a size of 15 cm×15 cm is placed to prepare a laminated sample. The laminated sample is pressed under the conditions of 180° C., 10 MPa and 5 minutes to cure the epoxy resin composition.

The laminate of the mold release film, the layer having the epoxy resin composition cured and the aluminum plate, is cut into 25 mm width, to prepare five test specimens.

With respect to each test specimen, the 180 degree peeling force at 180° C. is measured at a rate of 100 mm/min by means of a tensile tester. In the force (N)-gripping movement distance curve, the average value (unit N/cm) of the peeling force from 25 mm to 125 mm in gripping movement distance, is obtained.

An arithmetic average of the average values of peeling forces of the five test specimens is obtained, and the obtained value is taken as the peeling force (180° C.) of the epoxy resin.

Epoxy Resin Composition:

8 parts by mass of a phenylene skeleton-containing phenol aralkyl type epoxy resin (softening point: 58° C., epoxy equivalent: 277), 2 parts by mass of a bisphenol A type epoxy resin (melting point: 45° C., epoxy equivalent: 172), 2 parts by mass of a phenylene skeleton-containing phenol aralkyl resin (softening point: 65° C., hydroxy equivalent: 165), 2 parts by mass of a phenol novolak resin (softening point: 80° C., hydroxy equivalent: 105), 0.2 part by mass of a curing accelerator (triphenylphosphine), 84 parts by mass of an inorganic filler (fused spherical silica having a median diameter of 16 μm), 0.1 part by mass of carnauba wax, 0.3 part by mass of carbon black, 0.2 part by mass of a coupling agent (3-glycidoxypropyltrimethoxysilane).

One having the above materials pulverized and mixed for 5 minutes by a super mixer.

<Adhesive Force (180° C.)>

In accordance with JIS Z0237; 2009 (ISO29862; 2007), the 180 degree peeling adhesive force (N/24 mm) at 180° C. against a stainless steel (SUS) plate is measured, and the obtained value is taken as the 180° C. adhesive force.

<Migration Property>

A cardboard having a thickness of 1 mm, the mold release film, an aluminum plate made of a A1N30H-H18 according to JIS H4160; 2006 having a thickness 0.1 mm, and a cardboard having a thickness of 1 mm are overlaid in this order so that the adhesive layer of the mold release film and said aluminum plate are in contact, and pressed for 20 minutes under the conditions of 180° C. and 5 MPa; the mold release film is peeled from the aluminum plate; the surface of the aluminum plate which is in contact with the mold release film before and after the pressing is analyzed by X-ray photoelectron spectroscopy, whereby the Al element peak intensities before and after the pressing are obtained, and the (Al element peak intensity after pressing/ Al element peak intensity before pressing) is obtained.

(Method for Producing Mold Release Film)

The mold release film 1 may be produced, for example, by a production method having the following process.

Mold release film production process: A process wherein on one side of a substrate 3, a coating liquid for adhesive layer comprising the above-mentioned composition for adhesive layer and a liquid medium, is applied and dried to form an adhesive layer 5.

During the drying, the reaction of the hydroxy group-containing acrylic polymer and the polyfunctional isocyanate compound proceeds to form a reaction cured product thereby to form the adhesive layer 5.

Further, after the above process, heating may be carried out to accelerate curing of the composition for adhesive layer.

The substrate 3 is as defined above. On the surface of the substrate 3 on which the coating liquid for adhesive layer is to be applied, surface treatment may be applied in order to improve the adhesion to the adhesive layer 5. As such surface treatment, corona treatment, plasma treatment, coating of a silane coupling agent, coating of an adhesive, etc. may be mentioned.

The coating liquid for adhesive layer comprises the above-mentioned composition for adhesive layer and a liquid medium. That is, it comprises the hydroxy group-containing acrylic polymer, the polyfunctional isocyanate compound and the liquid medium, and may contain other components as required.

The hydroxy group-containing acrylic polymer, the polyfunctional isocyanate compound, other components, $M_{COOH}/(M_{NCO}-M_{OH})$, $M_{NCO}/(M_{COOH}+M_{OH})$ in the coating liquid for adhesive layer, are respectively the same as defined above.

The liquid medium may be water, an organic solvent, etc. The organic solvent may, for example, be an alcohol compound, an ester compound, etc.

The solid content concentration in the coating liquid for adhesive layer is preferably 5 to 30 mass %, particularly preferably from 10 to 30 mass %. When the solid content concentration is at least the lower limit value in the above range, cissing is unlikely to occur when applied on the substrate 3. When the solid content concentration is at most the upper limit value in the above range, the leveling property of the coated surface will be excellent.

As the method for applying the coating liquid for adhesive layer, it is possible to use various known wet coating methods, and, for example, a gravure coating method, a die coating method, a bar coating method, etc. may be mentioned.

The drying temperature is preferably from 45 to 100° C.

Advantageous Effects

In the mold release film 1, the adhesive layer 5 in contact with the semiconductor chip, source electrode or sealing glass, and with the curable resin, at the time of forming a resin sealed portion, is a reaction cured product of the above-mentioned composition for adhesive layer, whereby the releasability against the resin sealed portion, and the low migration property and peeling property against the semiconductor chip, source electrode or sealing glass, will be excellent.

Further, in the mold release film 1, the layer in contact with the exposed portion of the semiconductor chip, source electrode or sealing glass, at the time of forming a resin sealed portion, is the adhesive layer 5, whereby it is possible to obtain an exposed element wherein the mold release film is in close contact with the exposed portion and leakage of the curable resin to the exposed portion is reduced.

Further, in the mold release film 1, the storage elastic modulus (180° C.) of the substrate 3 is within the above range, whereby it shows proper strength and elongation at the time of following the mold, and thus is excellent in mold following property. For example, even to a mold with a complex shape to be used in the case of producing a semiconductor element with a complicated shape while having an exposed portion, such as a sensor, the mold release film 1 will sufficiently follow, and breakage or pinholes, accompanying leakage of the curable resin to the mold side, wrinkles of the mold release film, and accompanying troubles such as defects on the appearance of the resin sealed portion, will be unlikely to occur.

In the foregoing, the mold release film of the present invention has been described with reference to the first embodiment, but the present invention is not limited to the above embodiment. The respective constructions in the above embodiment and their combinations, are merely exemplary, and various additions, omissions, substitutions or other modifications of the constructions are possible within a range not departing from the scope and spirit of the present invention.

In the first embodiment, an example wherein the substrate 3 is a single layer structure, is shown, but the substrate 3 may be a multilayer structure. The multi-layer structure may, for example, be a structure in which a plurality of layers each containing a releasing resin, are laminated. In such a case, the releasing resin contained in each of the plurality of layers may be the same or different. From the viewpoint of the mold following property, tensile elongation, production cost, etc., the substrate 3 is preferably a single-layer structure.

In the first embodiment, one having a substrate and an adhesive layer directly laminated is shown, but the mold release film of the present invention may comprise another layer between the substrate and the adhesive layer. Otherwise, it may comprise another layer on the side opposite to the adhesive layer side of the substrate.

Such another layer may, for example, be a gas barrier layer, an antistatic layer, a colored layer, etc. As such another layer, one type may be used alone, or two or more types may be used in combination. The thickness of another layer is preferably from 0.05 to 3 μm, particularly preferably from 0.05 to 2 μm.

It is preferred to have an antistatic layer between the substrate and the adhesive layer, in that it is thereby possible to effectively prevent breakage of the semiconductor chip due to discharge at the time of peeling.

The antistatic layer is a layer containing an antistatic agent. As the antistatic agent, the same one as mentioned above, may be mentioned.

In the antistatic layer, the antistatic agent is preferably dispersed in a resin binder. As the resin binder, preferred is one having a heat resistance durable to a heat (e.g. 180° C.) in the sealing step, and, for example, an acrylic resin, a silicone resin, an urethane resin, a polyester resin, a polyamide resin, a vinyl acetate resin, an ethylene-vinyl acetate copolymer, an ethylene-vinyl alcohol copolymer, a chlorotrifluoroethylene-vinyl alcohol copolymer, a tetrafluoroethylene-vinyl alcohol copolymer, etc. may be mentioned.

The resin binder may be crosslinked. When the resin binder is crosslinked, as compared with the case not crosslinked, the heat resistance is excellent.

The surface resistance of the antistatic layer is preferably at most $10^{10} \Omega/\square$, more preferably at most $10^{9} \Omega/\square$.

The mold release film of the present invention is preferably one having a layered structure of any one of the adhesive layer/substrate, the adhesive layer/antistatic layer/substrate, the adhesive layer/gas barrier layer/substrate, from the side in contact with the curable resin at the time of forming a resin sealed portion. Among these, from the viewpoint of excellent adhesion between the adhesive layer and the substrate, as in the first embodiment, one with a two-layer structure of the adhesive layer/substrate of a single layer structure, is especially preferred.

[Semiconductor Element]

A semiconductor element to be produced by the method for producing a semiconductor element of the present invention as described below is one which has a semiconductor chip and a resin sealed portion and may have a source electrode (also referred to as a "source terminal") or a sealing glass, as necessary, wherein a part of the surface of the semiconductor chip, the source electrode or the sealing glass is exposed.

The resin sealed portion is one to be formed from a curable resin. As the curable resin, a thermosetting resin such as an epoxy resin, a silicone resin, etc., is preferred, and an epoxy resin is particularly preferred.

The sealing glass is a glass plate laminated on a semiconductor chip via a rib member (spacer) for sealing the semiconductor chip in an airtight space. The sealing glass also functions as a light detector in a sensor (semiconductor element) such as a CCD image sensor or a CMOS image sensor.

The semiconductor element of the present invention may be one having a source electrode or sealing glass, or one having no source electrode or sealing glass.

In the case of one having no source electrode and no sealing glass, one, of which a part of the surface is exposed, is a semiconductor chip.

In the case of one having a source electrode, typically, one, of which a part of the surface is exposed, will be the source electrode, and the semiconductor chip will have its surface covered by the resin sealed portion, the source electrode and other members and will not be exposed.

In the case of one having a sealing glass, typically, one, of which a part of the surface is exposed, will be the sealing glass, and the semiconductor chip will be sealed by the substrate, the sealing glass, the rib member and the resin-sealed portion, and will not be exposed.

In the semiconductor element, in addition to the semiconductor chip, the source electrode and the sealing glass, a part of the surface of a component associated with the semiconductor chip may be exposed. The component associated with the semiconductor chip may, for example, be solder bumps.

As the semiconductor element, an integrated circuit having semiconductor elements integrated, such as a transistor, a diode, etc.; a light emitting diode having a light-emitting element, etc. may be mentioned.

The element shape of the integrated circuit may, for example, be BGA (Ball Grid Array), QFN (Quad Flat Non-leaded package), SON (Small Outline Non-leaded package), etc.

As the semiconductor element, from the viewpoint of productivity, preferred is one to be produced via a batch encapsulation and singulation, and, for example, an integrated circuit wherein the sealing system is a MAP (Moldied Array Packaging) system or a WL (Wafer Lebel packaging) system, may be mentioned.

Figure 2:
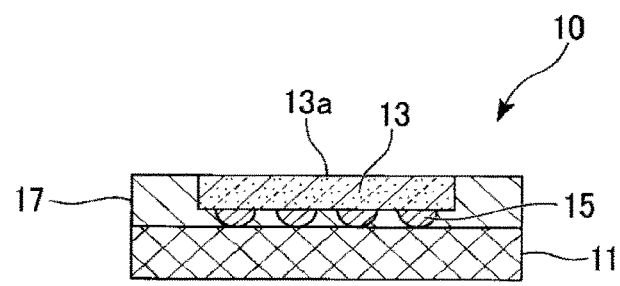
FIG. 2 is a schematic cross-sectional view showing an example of a semiconductor element to be produced by the method for producing a semiconductor element of the present invention.

FIG. 2 is a schematic cross-sectional view showing an example of a semiconductor element.

A semiconductor element 10 of this example has a substrate 11, a semiconductor chip 13, a plurality of bumps 15 for bonding the semiconductor chip 13 to the substrate 11, and a resin sealed portion 17.

The substrate 11 may, for example, be a printed wiring board, a lead frame, etc.

The resin sealed portion 17 seals a space between the main surface (the surface on the substrate 11 side) of the semiconductor chip 13 and the substrate 11, and side surfaces of the semiconductor chip 13, and the back surface 13a (the surface opposite to the substrate 11 side) of the semiconductor chip 13 constitutes an exposed portion.

Figure 3:
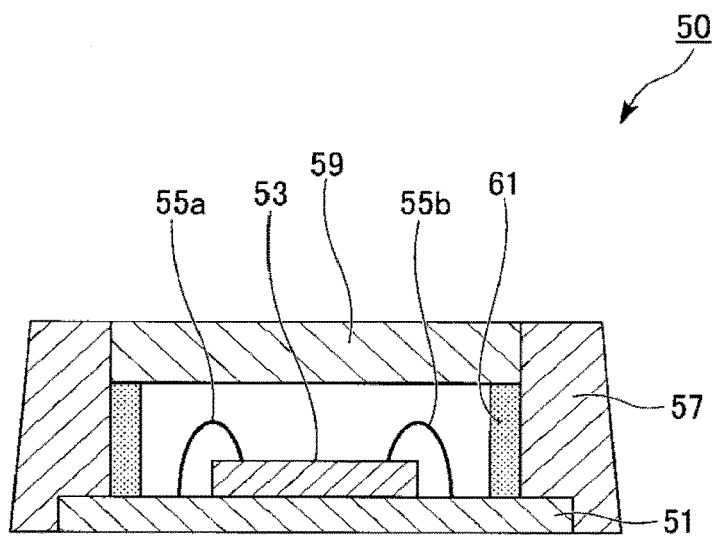
FIG. 3 is a schematic cross-sectional view showing another example of a semiconductor element to be produced by the method for producing a semiconductor element of the present invention.

FIG. 3 is a schematic cross-sectional view showing another example of a semiconductor element.

A semiconductor element 50 of this example has a substrate 51, a semiconductor chip 53, a resin sealed portion 57, a sealing glass 59, and a rib member 61.

The substrate 51 may, for example, be a printed wiring board, a lead frame, etc.

The semiconductor chip 53 is bonded to the substrate 51 by a plurality of bonding wires 55a and 55b.

The rib member 61 is provided on the substrate 51 so as to surround the semiconductor chip 53. The height of the rib member 61 is higher than the height of the semiconductor chip 53, and the sealing glass 59 is disposed on the rib member 61. Thus, between the substrate 51 and the sealing glass 59 and the rib member 61, a space for sealing the semiconductor chip 53 is formed.

The resin sealed portion 57 is in a shape of a frame extending upward from the peripheral portion of the substrate 51, and in contact with the outer peripheral surface of the substrate 51, the outer peripheral surface of the rib member 61 and the outer peripheral surface of the sealing glass 59.

In the semiconductor element 50, the upper surface (the surface opposite to the substrate 51 side) of the sealing glass 59 constitutes an exposed portion. The side surface of the sealing glass 59 is in contact with the resin sealed portion 57.

Here, in this example, the height of the resin sealed portion 57 is the same as the height of the upper surface of the sealing glass 59, but the height of the resin sealed portion 57 may be higher than the height of the upper surface of the sealing glass 59. In such a case, a part (peripheral portion) of the top surface of the sealing glass 59 may be in contact with the resin sealed portion 57. Further, here, in this example, the rib member 61 is disposed on the substrate 51, but the rib member 61 may be disposed on the semiconductor chip 53. In such a case, the substrate 51 is provided with an inner conductor pad (upper surface side) and an outer conductor pad (lower surface side) electrically connected to each other via through holes, and the inner conductor pad is connected to the semiconductor chip 53 via bonding wires.

[Method for Producing Semiconductor Element]

The method for producing a semiconductor element of the present invention is a method for producing a semiconductor element having a semiconductor chip and a resin sealed portion formed from a curable resin, and having, as necessary, a source electrode or a sealing glass, and having a part of the surface of the semiconductor chip, source electrode or sealing glass exposed, which comprises a step of disposing the mold release film of the present invention on the surface of a mold to be in contact with a curable resin, so that its substrate side surface is in contact with the mold surface, and disposing, in the mold, a structure having a semiconductor chip and having, as necessary, a source electrode or a sealing glass, a step of clamping the mold, so that the mold is, via the mold release film, in contact with the surface of the semiconductor chip, electrode or sealing glass, a step of filling and curing a curable resin in the mold, while clamping the mold, to form a resin sealed portion, thereby to obtain a sealed body having said structure and said resin sealed portion, and having a part of the surface of the semiconductor chip, source electrode or sealing glass exposed, and a step of releasing the sealed body from the mold.

For the method for producing a semiconductor element of the present invention, it is possible to employ a known production method except for using the mold release film of the present invention. For example, as the forming method of the resin sealed portion, a transfer molding method may be employed, and as an apparatus to be used at that time, it is possible to use a known transfer molding apparatus. Also, the production conditions may be the same conditions as in the known method for producing a semiconductor element.

First Embodiment

With reference to FIGS. 4 to 7, a first embodiment of the method for producing a semiconductor element of the present invention will be described. This embodiment is an example wherein by using as a mold release film, the above-described mold release film 1, a semiconductor element 10 as shown in FIG. 2 is produced by a transfer molding method.

The method for producing a semiconductor element of this embodiment comprises the following steps (1) to (6).

Figure 4:
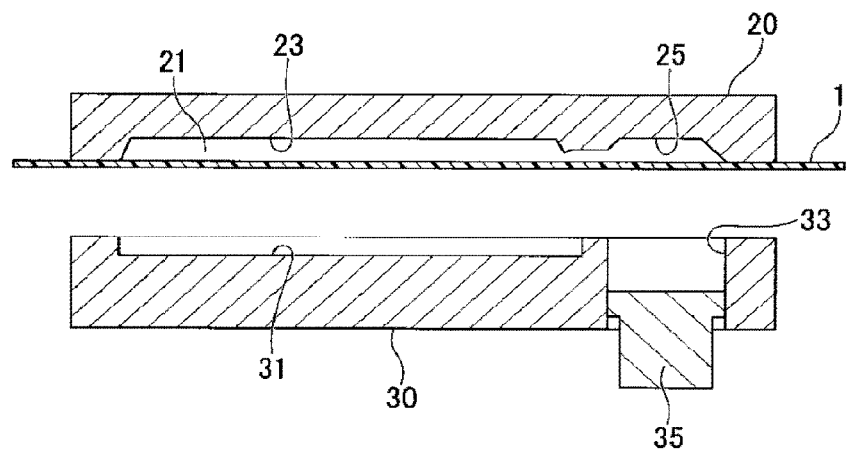
FIG. 4 is a cross-sectional view showing a step (1) in the first embodiment of the method for producing a semiconductor element of the present invention.

Step (1): a step of disposing a mold release film 1 so that the substrate side surface 1b of the mold release film 1 covers the cavity 21 of an upper mold 20 of a mold having the upper mold 20 and the lower mold 30 (FIG. 4).

Figure 5:
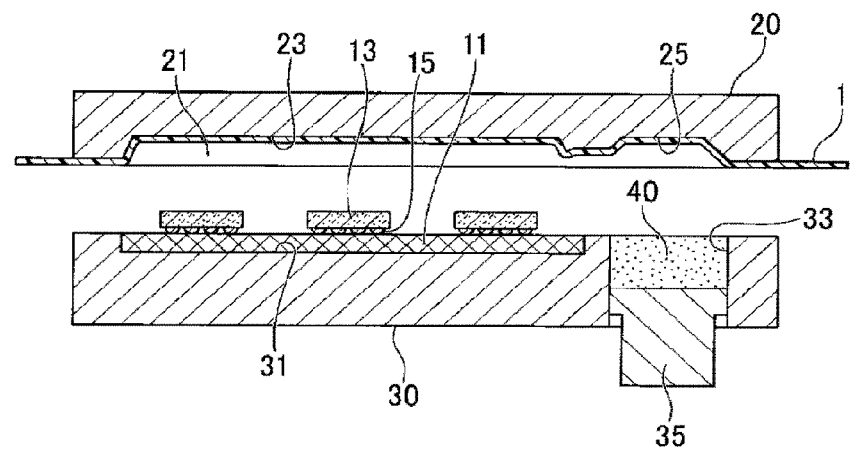
FIG. 5 is a cross-sectional view showing a step (2) in the first embodiment of the method for producing a semiconductor element of the present invention.

Step (2): a step of vacuum-suctioning the mold release film 1 to the side of the cavity surface 23 of the upper mold 20, and separately, disposing on a substrate placement portion 31 of the lower mold 30, a substrate 11 of an assembly (structure) in which a plurality of semiconductor chips 13 are bonded to the substrate 11 surface by bumps 15 (FIG. 5).

Figure 6:
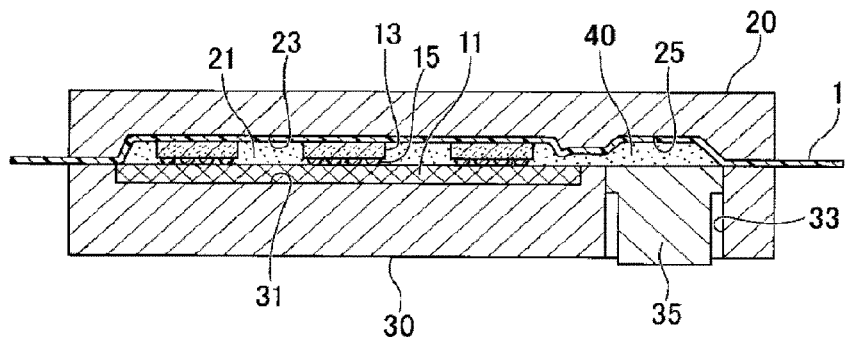
FIG. 6 is a cross-sectional view showing a step (3) in the first embodiment of the method for producing a semiconductor element of the present invention.

Step (3): a step of clamping the upper mold 20 and the lower mold 30, to let the mold release film 1 be in close contact with the back surfaces of the semiconductor chips 13, and pushing up a plunger 35 of a resin placement portion 33 of the lower mold 30, to fill a curable resin 40 preliminarily disposed in the resin placement portion 33, into the cavity 21 via a resin introduction portion 25 of the upper mold 20 (FIG. 6).

Step (4): a step of curing the curable resin 40 filled in the cavity 21 to form a resin sealed portion 17 to obtain a sealed body 100.

Figure 7:
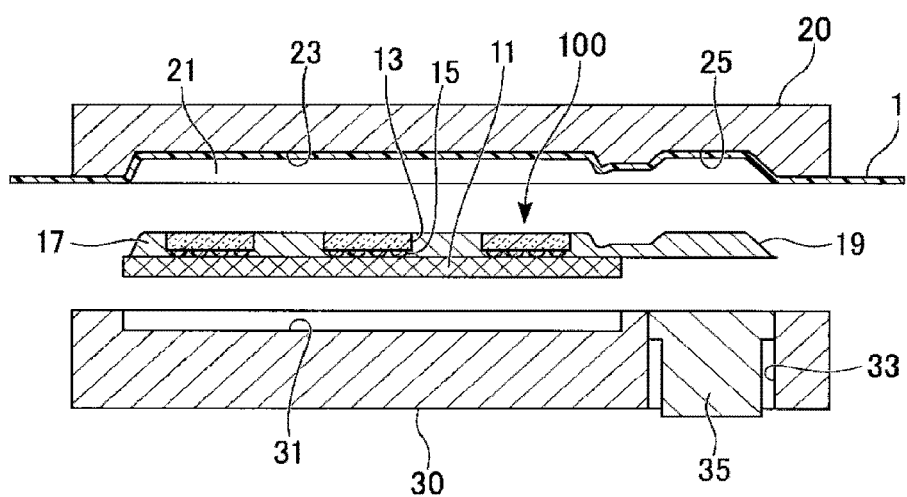
FIG. 7 is a cross-sectional view showing a step (5) in the first embodiment of the method for producing a semiconductor element of the present invention.

Step (5): a step of taking out the sealed body 100 from the mold (FIG. 7).

Step (6): a step of cutting the sealing body 100 to separate the plurality of semiconductor chips 13 to obtain a plurality of semiconductor elements 10.

In step (1), the mold release film 1 is disposed so that the surface 1b on the substrate 3 side of the mold release film 1 is in contact with the cavity surface 23 of the upper mold 20, i.e. the surface 1a on the adhesive layer 5 side faces the opposite side (the space in the cavity 21).

Step (3) is a so-called mold underfill (MUF) process.

Clamping in step (3) is conducted under a clamping pressure of preferably from 0.05 to 2 MPa, particularly preferably from 0.2 to 1 MPa per one semiconductor chip. When the clamping pressure is at least the lower limit value in the above range, even when there is variation in heights of the plurality of semiconductor chips 13, the mold release film will be in sufficiently close contact with the back surfaces (the exposed portions) of the respective semiconductor chips 13, whereby it is possible to prevent leakage of the curable resin to the respective back surfaces. When the clamping pressure is at most the upper limit value in the above range, breakage of the semiconductor chips 13 is less likely to occur at the time of mold clamping.

In the present invention, by using the above-described mold release film, even under a clamping pressure lower than the conventional clamping pressure, it is possible to sufficiently prevent leakage of the curable resin.

In step (5), at the resin sealed portion 17 of the sealed body 100 taken out from the mold, a cured product 19 having the curable resin 40 cured in the resin introduction portion 25 is attached. Such a cured product 19 is usually cut off.

Before or after step (6), if necessary, on the surface of the resin sealed portion 17, an ink layer may be formed by using an ink.

In the foregoing, the method for producing a semiconductor element of the present invention has been described with reference to the first embodiment, but the present invention is not limited to the above embodiment. The respective constructions and their combinations in the above embodiment are exemplary, and within a range not departing from the scope and spirit of the present invention, additions, omissions, substitutions and other modifications may be made.

The timing of peeling off the resin sealed portion from the mold release film is not limited at the time when the resin sealed portion is taken out from the mold, but it is possible that the resin sealed portion is taken out together with the mold release film from the mold, and then, the mold release film is peeled from the resin sealed portion.

The distance between the plurality of semiconductor elements collectively sealed may be uniform or non-uniform. From such a viewpoint that the load exerted to each of the plurality of semiconductor elements would be uniform (the load becomes minimum), it is preferred to equalize the distance between the plurality of semiconductor elements.

The mold is not limited to that shown in the first embodiment, and a known one may be used.

The mold release film may be a mold release film of the present invention and is not limited to the mold release film 1.

The semiconductor element to be produced by the method for producing a semiconductor element of the present invention is not limited to the semiconductor element 10. Depending on a semiconductor element to be produced, step (6) may not be conducted. The semiconductor element to be sealed in the resin sealed portion may be one or more. The shape of the resin sealed portion is not limited to that shown in FIG. 2, and it may be a shape having a step, a slope, a curved surface, etc.

For example, a semiconductor element to be produced may be one provided with a sealing glass, such as a semiconductor element 50 or may be one provided with a gate electrode. The semiconductor element 50 may, for example, be produced in the same manner as described above, except that the shape of the cavity 21 of the upper mold 20 is changed to a shape corresponding to the resin sealed portion 57; instead of the assembly in step (2), an assembly is used wherein a plurality of semiconductor chips 53 are respectively bonded to the substrate 51 surface by bonding wires 55a and 55b; the sealing glass 59 is laminated via the rib member 61 provided around it; and by clamping in step (3), the mold release film 1 is brought in close contact with the upper surface of the sealing glass 59.

EXAMPLES

In the following, the present invention will be described in detail with reference to Examples. However, the present invention is not limited by the following description.

Among the following Ex. 1 to 21, Ex. 1 to 3, 5 to 8, 13, 14, 16, and 18 to 21 are Examples of the present invention, and Ex. 4, 9 to 12, 15, and 17 are Comparative Examples.

The evaluation methods and materials used in each Ex. are shown below.

[Evaluation Methods]
(Thickness)

The thickness of a substrate (μm) was measured in accordance with ISO 4591; 1992 (JIS K7130; B1 method in 1999, method of measuring the thickness, by a mass method, of a sample taken from a plastic film or sheet).

The thickness of an adhesive layer (μm) was measured by a transmission type infrared film thickness meter RX-100 (trade name, manufactured by Kurabo Industries Ltd.).

(Arithmetic Average Roughness Ra of Substrate Surface)

The arithmetic average roughness Ra (μm) of a substrate surface was measured in accordance with JIS B0601; 2013 (ISO 4287; 1997, Amd. 1; 2009). The standard length lr (cut-off value λc) was set to be 0.8 mm, and the measurement length was set to be 8 mm. In the measurement, using SURFCOM 480A (manufactured by Tokyo Seimitsu Co., Ltd.), Ra was obtained at three places in a direction perpendicular to the flow direction during the production of the film and at three places in a direction parallel thereto i.e. at a total of six places, and the average value was taken as Ra of the surface.

(Storage Elastic Modulus (180° C.))

Using a dynamic viscoelasticity measuring apparatus Solid L-1 (manufactured by Toyo Seiki Co., Ltd.), the storage elastic modulus (180° C.) of a substrate was measured in accordance with ISO 6721-4; 1994 (JIS K7244-4; 1999). By setting the frequency to be 10 Hz, the static force to be 0.98 N and the dynamic displacement to be 0.035%, and raising the temperature from 20° C. at a rate of 2° C./min, the storage elastic modulus at 180° C. was measured.

The storage elastic modulus of an adhesive layer (180° C.) was measured in the same manner as the storage elastic modulus of the substrate (180° C.), with respect to a measurement sample prepared by the following procedure.

<Measurement Sample>

To silicone-coated PET (NS separator A (trade name), manufactured by Nakamoto Packs Co., Ltd.), a cardboard (thickness 1 mm) of 12 cm×12 cm having a hole of 10 cm×10 cm formed, was pasted to form a bank with a height of 1 mm. Into the inside thereof, a coating liquid for adhesive layer used to form the adhesive layer, was poured and dried at room temperature for 1 day; then, further dried in a vacuum drier at room temperature for 1 day, and further subjected to drying and aging at 40° C. for 3 days to prepare a film with a thickness of 200 μm. The film was used as a measurement sample.

(Insolubility Degree of Adhesive Layer)

Calculation of the Basis Weight of the Adhesive Layer (W1):

In each Ex, the basis weight (g/m$^2$) of the film (the substrate) before the coating liquid for adhesive layer is applied (hereinafter referred to as "the basis weight before coating") and the basis weight (g/m$^2$) of the film after the coating liquid for adhesive layer is applied and the adhesive layer is formed (the total basis weight of the film and the adhesive layer, hereinafter referred to as "the basis weight of the film after coating") were measured. From the results, the basis weight W1 (g/m$^2$) of the adhesive layer alone was calculated from the following formula.

$W1$=(basis weight of the film after coating)−(basis weight of the film before coating)

Dissolution Test:

The mold release film cut into 10 cm×10 cm was immersed in methylene chloride at from 20 to 25° C. and stirred for one day. The mold release film after completion of the stirring for one day was immersed and washed for 10 minutes in another methylene chloride at from 20 to 25° C. The mold release film after the washing was vacuum-dried at 100° C. for two hours.

Calculation of Insolubility Degree:

By measuring the mass of the mold release film after vacuum drying in the above dissolution test, the basis weight (g/m$^2$) of the mold releasing film (hereinafter referred to also as "the basis weight of the film after elution") was calculated. From the results, the basis weight W2 (g/m$^2$) of the adhesive layer remaining after the dissolution test was calculated by the following formula.

$W2$=(basis weight of the film after elution)−(basis weight of the film before coating)

From the obtained W1 and W2, the insolubility degree (%) was obtained by the following formula.

Insolubility degree (%)=($W2/W1$)×100

(Surface Resistance of Adhesive Layer)

The surface resistance (Ω/□) was measured in accordance with IEC 60093, the double ring electrode method. As the measuring device, an ultra high resistance meter R8340 (manufactured by Advantec) was used, and the measurement was carried out at an applied voltage of 500 V for an applied time of 1 minute.

(Peeling Force (180° C.) of Epoxy Resin)

On a square first metal plate (SUS304) having a thickness of 3 mm and a size of 15 cm×15 cm, a square aluminum foil having a thickness of 100 μm and a size of 15 cm×15 cm was placed; on the aluminum foil, a square spacer having a thickness of 100 mm and a size of 15 cm×15 cm and having a rectangular hole of 10 cm×8 cm formed at the center was placed; in the vicinity of the center in the hole, 2 g of the following epoxy resin composition was placed; further thereon, a square mold release film with a size of 15 cm×15 cm was placed so that the surface on the adhesive layer side faced the above spacer side; and thereon, a square second metal plate (SUS304) having a thickness of 3 mm and a size of 15 cm×15 cm was placed, to prepare a laminated sample.

The laminated sample was pressed under the conditions of 180° C. and 10 MPa, for 5 minutes, to cure the epoxy resin composition.

The laminate comprising the mold release film, a layer having the epoxy resin composition cured and the aluminum foil, was cut into 25 mm width, to prepare five test specimens.

With respect to each specimen, the 180 degree peel force at 180° C., was measured at a rate of 100 mm/min using a tensile tester (RTC-131-A, manufactured by Orientec Co., Ltd.). An average value (unit: N/cm) of the peeling force from 25 mm to 125 mm in the gripping movement distance in the force (N)-the gripping movement distance curve, was obtained.

An arithmetic average of the average values of the peeling strengths of the five test specimens was obtained, and the obtained value was taken as the peeling force (180° C.) of the epoxy resin.

Epoxy Resin Composition:

8 parts by mass of phenylene skeleton-containing phenol aralkyl type epoxy resin (softening point: 58° C., epoxy equivalent: 277), 2 parts by mass of bisphenol A type epoxy resin (melting point: 45° C., epoxy equivalent: 172), 2 parts by mass of phenylene skeleton-containing phenol aralkyl resin (softening point: 65° C., hydroxy equivalent: 165), 2 parts by mass of phenol novolak resin (softening point: 80° C., hydroxy equivalent: 105), 0.2 part by mass of a curing accelerator (triphenylphosphine), 84 parts by mass of an inorganic filler (fused spherical silica with a median diameter of 16 μm), 0.1 part by mass of carnauba wax, 0.3 part by mass of carbon black, 0.2 part by mass of a coupling agent (3-glycidoxypropyltrimethoxysilane).

One having the above components pulverized and mixed for 5 minutes by a super mixer.

The glass transition temperature of the cured product of the epoxy resin composition was 135° C.; the storage elastic modulus at 130° C. was 6 GPa; and the storage elastic modulus at 180° C. was 1 GPa.

(Adhesive Force (180° C.))

As the adhesive force (180° C.), the 180 degree peeling adhesive force (N/24 mm) at 180° C. to a stainless steel plate was measured in accordance with JIS Z0237; 2009 (ISO29862; 2007). Specifically, to a stainless steel plate (SUS304 CP BA (subjected to cold rolling, followed by bright heat treatment)) of 50 mm×125 mm having a thickness of 0.1 mm, a mold release film having a width of 24 mm and a length of 300 mm, was press-bonded so that the adhesive layer side faced the stainless steel plate side, by reciprocating a manual pressure roller weighing 1 kg at a temperature of 180° C. twice at a speed of 10 mm/sec. With respect to the press-bonded test specimen, within 1 minute, the 180 degree peeling adhesive force (N/24 mm) was measured on a hot plate at 180° C. by a digital gauge. Here, the measured value (N/24 mm), was, without being converted to N/10 mm, adopted as it was, as the 180 degree peeling adhesive force.

(Migration Property)

On a cardboard (size: 5 cm×10 cm) having a thickness of mm, an aluminum plate (size: 5 cm×10 cm) made of A1N30H-H18 material in JIS H4160; 2006 and having a thickness of 0.1 mm, and washed by immersion in acetone, was placed; thereon, a mold release film (size: 5 cm×10 cm) was placed so that the surface to be in contact with an exposed portion (the adhesive layer side) faced the lower side (the aluminum plate side); and thereon (on the surface side to be in contact with a mold), a cardboard (size: 5 cm×10 cm) having a thickness of 1 mm was further placed to obtain a laminated sample. The laminated sample was placed in a press machine heated at 180° C. and pressed for 5 minutes under a pressure of 5 MPa. After the pressing, the cardboards on both sides were removed, and the surface of the aluminum plate before pressing and the surface of the aluminum plate after pressing which was in contact with the mold release film, were, respectively, analyzed by an X-ray photoelectron spectroscopy (XPS). From the analysis results, the ratio of the peak area of aluminum atoms at the surface of the Al plate after peeling, to the peak area of aluminum atoms at the surface before pressing (Al peak area after pressing/Al peak area before pressing) was obtained.

For the XPS, an X-ray photoelectron spectroscopy apparatus of QuanteraSXM type manufactured by ULVAC-PHI, Inc. was used. As the X ray source, a monochromatic AlKα ray was used at 15 kV at 25 W; the X-ray irradiation surface photoelectron detection angle was set to be 45-degree; the Pass Energy of photoelectron was set to be 114 eV; the number of measurements was 10 times; and the analysis area was set to be 0.5 mm×0.5 mm. The (Al element peak area before pressing/Al element peak area after pressing) was obtained from the average of triplicate measurements, using the peak intensities of Al (1s) detected under the above conditions.

(Sealing Test)

The sealing test was carried out by using a sealing apparatus having the same construction as one shown in FIG. 3 (transfer molding apparatus G-LINE Manual System, manufactured by APIC YAMADA CORPORATION).

On a lead frame of 50 mm×50 mm, 10×10 pieces of semiconductor chips of 1 mm×1 mm having a thickness of 0.1 mm were mounted and subjected to the sealing test. As a curable resin, the same epoxy resin composition as used in the above evaluation of the peeling force at 180° C. of an epoxy resin, was used. The mold release film was set in roll-to-roll on rolls of 100 mm width.

After placing the lead frame having semiconductor chips mounted thereon in a lower mold, the mold release film was vacuum-suctioned to an upper mold; then, the mold was clamped under the following conditions, and a curable resin was injected. After pressing for 5 minutes, the mold was opened, and the semiconductor element was taken out. The peeled state between the mold release film and the resin sealed portion (the cured product of the curable resin), the appearance of the exposed portions of the semiconductor chips were visually confirmed and evaluated in accordance with the following standards. Further, the charged voltage of the semiconductor element was measured.

<Sealing Conditions>
Mold clamping pressure: 0.5 MPa per one semiconductor chip.
Transfer pressure: 5 MPa.
Mold temperature (sealing temperature): 180° C.

<Peeled State Between the Mold Release Film and the Resin Sealed Portion>
○ (good): Properly peeled.
x (bad): Not properly peeled, and the lead frame was out of the lower mold.

<Appearance of the Exposed Portion of the Semiconductor Chip>
○ (good): resin covering or transfer of migrated substance from the film being less than two.
x (bad): resin covering or transfer of migrated substance from the film being more than two.

<Charged Voltage of the Semiconductor Element after Sealing>
The charged voltage of the semiconductor element taken out, was measured at a measuring distance of 10 mm by a non-contact type surface potential meter Model 520-1 (manufactured by TREK JAPAN).

[Materials Used]
(Substrate)

ETFE film: Fluon (registered trademark) ETFE C-88AXP (manufactured by Asahi Glass Company, Limited) was fed to an extruder equipped with a T-die and withdrawn between a pressing roll with surface irregularities and a metal roll with a mirror surface, to form a film having a thickness of 50 μm. The temperature of the extruder and the T die was 320° C., and the temperature of the pressing roll and the metal roll was 100° C. Ra of the surface of the obtained film was 2.0 μm on the pressing roll side and 0.2 μm on the mirror surface side. The mirror side was subjected to corona treatment so that the wetting tension in accordance with ISO8296; 1987 (JIS K6768; 1999) would be at least 40 mN/m.

The storage elastic modulus (180° C.) of the ETFE film was 40 MPa.

(Materials for Adhesive Layer)
<Hydroxy Group-Containing Acrylic Polymer>
Acrylic polymer 1: Nissetsu (registered trademark) KP2562 (manufactured by Nippon Carbide Industries Co., Inc.).
Acrylic polymer 2: TERPLUS (registered trademark) N3508 (manufactured by Otsuka Chemical Co., Ltd.).
Acrylic polymer 3: TEISANRESIN (registered trademark) WS-023 (manufactured by Nagase ChemteX Corporation).

With respect to each of acrylic polymers 1 to 3, the molecular weight, hydroxy value, acid value, glass transition temperature Tg and crosslinkably functional group equivalent amount are shown in Table 1.

TABLE 1

|  | Copolymer composition | Amount of solid content (mass %) | Mass average molecular weight | Hydroxy value (mgKOH/g) | Acid value (mgKOH/g) | Tg (° C.) | Crosslinkably functional group equivalent amount (g/mol) |
|---|---|---|---|---|---|---|---|
| Acrylic polymer 1 | 2-ethylhexyl acrylate/hydroxybutyl acrylate = 84/16 (molar ratio) | 35 | 200,000 | 70 | 0 | −25 | 800 |
| Acrylic polymer 2 | Butyl acrylate/2-hydroxybutyl acrylate = 98/2 (molar ratio) | 21 | 600,000 | 20 | 0 | −55 | 2,805 |

TABLE 1-continued

|  | Copolymer composition | Amount of solid content (mass %) | Mass average molecular weight | Hydroxy value (mgKOH/g) | Acid value (mgKOH/g) | Tg (° C.) | Crosslinkably functional group equivalent amount (g/mol) |
|---|---|---|---|---|---|---|---|
| Acrylic polymer 3 | Ethyl acrylate/butyl acrylate/acrylonitrile/2-hydroxyethyl acrylate = 45/20/28/5/3 (molar ratio) | 30 | 500,000 | 13 | 20 | −10 | 1,700 |

<Polyfunctional Isocyanate Compound>

Polyfunctional isocyanate compound 1: Nissetsu CK157 (manufactured by Nippon Carbide Industries Co., Inc.), solid content: 100%, isocyanurate type hexamethylene diisocyanate, NCO content: 21 mass %.

Polyfunctional isocyanate compound 2: Coronate (registered trademark) HXR (manufactured by Tosoh Corporation), solid content: 100%, isocyanurate type hexamethylene diisocyanate, NCO content: 22 mass %.

Polyfunctional isocyanate compound 3: Coronate L (manufactured by Tosoh Corporation), solid content: 75%, polyisocyanate having 3 moles of tolylene diisocyanate (TDI) reacted with one mole of trimethylolpropane, NCO content: 13.5 mass %.

<Antistatic Agent>

Antistatic agent 1: HTCP-200T (manufactured by Japan Carlit Co., Ltd.), solid content: 8%, a toluene solution of a conductive polythiophene.

Antistatic agent 2: Sankonol (registered trademark) MEK-50R (manufactured by
Sanko Chemical Industry Co., Ltd.), solid content: 50%, lithium bistrifluoromethanesulfonylimide.

Antistatic agent 3: Sankonol (registered trademark) AD2600-50R (manufactured by Sanko Chemical Industry Co., Ltd.), solid content: 100%, a mixture of polyethylene glycol bis(2-ethylhexoate) and lithium bistrifluoromethanesulfonylimide.

(Materials for Antistatic Layer)

Antistatic agent-containing material: ARACOAT (registered trademark) AS601D (manufactured by Arakawa Chemical Industries, Ltd.), solid content: 3.4%, conductive polythiophene: 0.4%, acrylic resin: 3.0%.

Curing agent: ARACOAT (registered trademark) CL910 (manufactured by Arakawa Chemical Industries, Ltd.), solid content: 10%, polyfunctional aziridine compound.

[Ex. 1]

A coating liquid for adhesive layer was prepared by mixing 100 parts by mass of acrylic polymer 1, 4 parts by mass of polyfunctional isocyanate compound 1 and ethyl acetate. The amount of ethyl acetate blended was such an amount that the solid content of the coating liquid for adhesive layer would be 25 mass %.

On the surface of the ETFE film having corona treatment applied, the coating liquid for adhesive layer was applied by using a gravure coater and dried, to form an adhesive layer having a thickness of 2 μm. The coating was conducted by a direct gravure method by using, as a gravure plate, a roll with lattice 150# of 100 mm in diameter×250 mm in width and a depth of 40 μm. The drying 1 was conducted at 100° C. for 1 minute by passing through a roll support drying oven at an air flow of 19 m/sec. Then, aging was conducted under the conditions of 40° C. for 120 hours, to obtain a mold release film.

[Ex. 2 to 17]

In the same manner as in Ex. 1 except for changing the type of the hydroxy group containing acrylic polymer, and the type or amount of the polyfunctional isocyanate compound as shown in Tables 2 and 3, a coating liquid for adhesive layer (solid content: 25 mass %) was prepared, and a mold release film was obtained.

Here, In Tables 2 and 3, the blend amount of each of acrylic polymers 1 to 3 and polyfunctional isocyanate compounds 1 to 3 is the total amount including the liquid medium.

[Ex. 18]

A coating liquid for antistatic layer (solid content: 2 mass %) was prepared by mixing 100 parts by mass of ARACOAT AS601D, 10 parts by mass of ARACOAT CL910 and 100 parts by mass of methanol.

On the surface of the ETFE film having corona treatment applied, the coating liquid for antistatic layer was applied by using a gravure coater and dried, to form an antistatic layer having a thickness of 0.1 μm. The coating was conducted by a direct gravure method by using, as a gravure plate, a roll with lattice 150# of 100 mm in diameter×250 mm in width and a depth 40 μm. The drying was carried out at 100° C. for one minute by passing through a roll support drying oven at an air flow of 19 m/sec.

Then, on the antistatic layer, an adhesive layer was formed in the same manner as in Ex. 1, to obtain a mold release film.

[Ex. 19 to 21]

In Ex. 19 to 21, an antistatic agent was incorporated to the coating liquid for adhesive layer (solid content: 25 mass %). Specifically, in the same manner as in Ex. 1 except for changing the type of the hydroxy group-containing acrylic polymer, the type of the polyfunctional isocyanate compound and the type or amount of the antistatic agent as shown in Tables 2 to 3, the antistatic agent-containing coating liquid for adhesive layer was prepared, and a mold release film was obtained.

The amount of each material in the coating liquid for adhesive layer used in each Ex., the number of moles of OH groups, the number of moles of COOH, the number of moles of NCO, $M_{COOH}/(M_{NCO}-M_{OH})$, $M_{NCO}/(M_{COOH}+M_{OH})$, the storage elastic modulus (180° C.) of the adhesive layer in the obtained mold release film, the insolubility degree of the adhesive layer, the surface resistance of the adhesive layer, the peeling force (180° C.) of the epoxy resin, the adhesive force (180° C.), the migration property, the state of peeling between the mold release film and the resin sealed portion, the appearance of the exposed portion of the semiconductor chip, the charged voltage of the semiconductor element after sealing, are shown in Tables 2 to 3.

TABLE 2

|  |  | 1 | 2 | 3 | 4 | 5 | 6 | 7 | 8 | 9 | 10 | 11 |
|---|---|---|---|---|---|---|---|---|---|---|---|---|
| Hydroxy group-containing acrylic polymer | Acrylic polymer 1 | 100 | 100 | 100 | 100 | 100 | 100 | 100 | 100 | — | — | — |
|  | Acrylic polymer 2 | — | — | — | — | — | — | — | — | 100 | 100 | 100 |
|  | Acrylic polymer 3 | — | — | — | — | — | — | — | — | — | — | — |
| Polyfunctional isocyanate compound | Polyfunctional isocyanate compound 1 | 4 | 6 | 12 | 35 | — | — | — | — | — | — | — |
|  | Polyfunctional isocyanate compound 2 | — | — | — | — | 6 | — | — | — | 1.2 | 10.2 | — |
|  | Polyfunctional isocyanate compound 3 | — | — | — | — | — | 15 | 25 | 40 | — | — | 22 |
|  | $M_{OH}$ (member of moles in blend) | 0.044 | 0.044 | 0.044 | 0.044 | 0.044 | 0.044 | 0.044 | 0.044 | 0.007 | 0.007 | 0.007 |
|  | $M_{COOH}$ (member of moles in blend) | 0 | 0 | 0 | 0 | 0 | 0 | 0 | 0 | 0 | 0 | 0 |
|  | $M_{NCO}$ (member of moles in blend) | 0.020 | 0.030 | 0.060 | 0.175 | 0.031 | 0.036 | 0.060 | 0.096 | 0.006 | 0.053 | 0.053 |
|  | $M_{COOH}/(M_{COOH} - M_{OH})$ | 0 | 0 | 0 | 0 | 0 | 0 | 0 | 0 | 0 | 0 | 0 |
|  | $M_{NCO}/(M_{COOH} + M_{OH})$ | 0.46 | 0.69 | 1.37 | 4.01 | 0.72 | 0.83 | 1.38 | 2.21 | 0.84 | 7.14 | 7.08 |
| Evaluation results | Storage elastic modulus (180° C.) of adhesive layer (MPa) | 3.1 | 6.7 | 12.8 | 22.3 | 7.5 | 2.5 | 4.5 | 6 | 0.1 | 1.7 | 1.3 |
|  | Insolubility degree of adhesive layer (%) | 50 | 70 | 80 | 95 | 75 | 45 | 55 | 65 | 20 | 35 | 35 |
|  | Surface resistance of adhesive layer (Ω/□) | $10^{15}$ | $10^{15}$ | $10^{15}$ | $10^{15}$ | $10^{15}$ | $10^{15}$ | $10^{15}$ | $10^{15}$ | $10^{15}$ | $10^{15}$ | $10^{15}$ |
|  | Peeling force (180° C.) of epoxy resin (N/cm) | 0.01 | 0.01 | 0.01 | 0.001 | 0.01 | 0.01 | 0.01 | 0.01 | 2 | 0.5 | 1 |
|  | Adhesive force (180° C.) (N/24 mm) | 0.04 | 0.01 | 0.006 | 0.001 | 0.01 | 0.04 | 0.02 | 0.013 | 0.80 | 0.11 | 0.20 |
|  | Migration property | 0.8 | 0.8 | 0.8 | 0.9 | 0.8 | 0.9 | 0.8 | 0.75 | <0.1 | 0.3 | 0.3 |
| Sealing test | Peeled state between mold release film and resin-sealed portion | ○ | ○ | ○ | ○ | ○ | ○ | ○ | ○ | x | x | x |
|  | Appearance of exposed portion of semiconductor chip | ○ | ○ | ○ | x | ○ | ○ | ○ | ○ | x | x | x |
|  | Charge voltage (V) of semiconductor element after sealing | 100 | 100 | 100 | 90 | 100 | 100 | 100 | 100 | 2,000 | 500 | 1,000 |

TABLE 3

|  |  | 12 | 13 | 14 | 15 | 16 | 17 | 18 | 19 | 20 | 21 |
|---|---|---|---|---|---|---|---|---|---|---|---|
| Hydroxy group-containing acrylic polymer | Acrylic polymer 1 | — | — | — | — | — | — | 100 | 100 | 100 | 100 |
|  | Acrylic polymer 2 | — | — | — | — | — | — | — | — | — | — |
|  | Acrylic polymer 3 | 100 | 100 | 100 | 100 | 100 | 100 | — | — | — | — |
| Polyfunctional isocyanate compound | Polyfunctional isocyanate compound 1 | — | — | — | — | — | — | 6 | 6 | 6 | 6 |
|  | Polyfunctional isocyanate compound 2 | — | — | — | 3 | 10 | 15 | — | — | — | — |
|  | Polyfunctional isocyanate compound 3 | 5 | 13 | 20 | — | — | — | — | — | — | — |
| Antistatic agent | Antistatic agent 1 | — | — | — | — | — | — | — | 70 | — | — |
|  | Antistatic agent 2 | — | — | — | — | — | — | — | — | 8 | — |
|  | Antistatic agent 3 | — | — | — | — | — | — | — | — | — | 8 |
|  | $M_{OH}$ (member of moles in blend) | 0.007 | 0.007 | 0.007 | 0.007 | 0.007 | 0.007 | 0.044 | 0.044 | 0.044 | 0.044 |
|  | $M_{COOH}$ (member of moles in blend) | 0.011 | 0.011 | 0.011 | 0.011 | 0.011 | 0.011 | 0 | 0 | 0 | 0 |
|  | $M_{NCO}$ (member of moles in blend) | 0.012 | 0.031 | 0.048 | 0.016 | 0.052 | 0.079 | 0.030 | 0.030 | 0.030 | 0.030 |
|  | $M_{COOH}/(M_{COOH} - M_{OH})$ | 2.1 | 0.4 | 0.3 | 1.2 | 0.2 | 0.1 | 0 | 0 | 0 | 0 |
|  | $M_{NCO}/(M_{COOH} + M_{OH})$ | 0.68 | 1.78 | 2.73 | 0.89 | 2.97 | 4.45 | 0.69 | 0.69 | 0.69 | 0.69 |
| Evaluation results | Storage elastic modulus (180° C.) of adhesive layer (MPa) | 2.1 | 3.5 | 4.5 | 2.8 | 6.5 | 10.2 | 6.7 | 6.7 | 6.7 | 6.7 |
|  | Insolubility degree of adhesive layer (%) | 40 | 50 | 55 | 40 | 50 | 55 | 70 | 70 | 70 | 70 |
|  | Surface resistance of adhesive layer (Ω/□) | $10^{15}$ | $10^{15}$ | $10^{15}$ | $10^{15}$ | $10^{15}$ | $10^{15}$ | $10^{15}$ | $10^{15}$ | $10^{15}$ | $10^{15}$ |
|  | Peeling force (180° C.) of epoxy resin (N/cm) | 1 | 0.05 | 0.05 | 0.5 | 0.01 | 0.01 | 0.01 | 0.01 | 0.01 | 0.01 |

TABLE 3-continued

|  |  | 12 | 13 | 14 | 15 | 16 | 17 | 18 | 19 | 20 | 21 |
|---|---|---|---|---|---|---|---|---|---|---|---|
| Adhesive force (180° C.) (N/24 mm) | | 0.06 | 0.025 | 0.02 | 0.06 | 0.02 | 0.01 | 0.01 | 0.01 | 0.01 | 0.01 |
| Migration property | | 0.6 | 0.8 | 0.8 | 0.8 | 0.6 | 0.5 | 0.7 | 0.7 | 0.7 | 0.7 |
| Sealing test | Peeled state between mold release film and resin-sealed portion | x | ○ | ○ | x | ○ | ○ | ○ | ○ | ○ | ○ |
| | Appearance of exposed portion of semiconductor chip | ○ | ○ | ○ | ○ | ○ | x | ○ | ○ | ○ | ○ |
| | Charge voltage (V) of semiconductor element after sealing | 1,000 | 200 | 200 | 500 | 100 | 100 | 10 | 10 | 10 | 10 |

As shown in the above results, in the mold release films in Ex. 1 to 3, 5 to 8, 13, 14, 16, and 18 to 21, the peeling force (180° C.) of the epoxy resin was at most 0.1 N/cm, whereby it was shown that releasability against the resin sealed portion was excellent. Further, it was at least 0.005 N/cm, whereby it was shown that the curable resin was less likely to leak in.

With these mold release films, the adhesive force (180° C.) was from 0.05 to 0.1 N/24 mm, whereby it was shown that the adhesion to the exposed portion of the semiconductor chip was excellent, and the peeling property from the exposed portion was also excellent.

Further, with these mold release films, the migration property was at least 0.6, whereby it was shown that migration from the adhesive layer to the exposed portion of the semiconductor chip was little.

Also in the actual sealing test, the peeled state between the mold release film and the resin sealed portion, and the evaluation result of the appearance of the exposed portion of the semiconductor chip were good.

Further, in the case where the mold release films in Ex. 18 to 21 were used wherein the adhesive layer contained an antistatic agent, or an antistatic layer is further formed between the substrate and the adhesive layer, the charged voltage of the semiconductor element after sealing was low, and they had excellent antistatic function.

On the other hand, in the case of the mold release film in Ex. 4 wherein $M_{NCO}/(M_{COOH}+M_{OH})$ was 4.01, the adhesive force (180° C.) was small. Further, the result of the appearance of the exposed portion of the semiconductor chip was also poor. This is considered to be because the crosslinking density was too high, and the elastic modulus of the adhesive layer was high, whereby the adhesion property became low, and as a result, adhesion between the exposed portion and the adhesive layer became insufficient, and the curable resin penetrated to the exposed portion.

In the case of the mold release films in Ex. 9 to 11 using acrylic polymer 2 with a crosslinkably functional group equivalent amount exceeding 2,000 g/mol, the peeling force (180° C.) of the epoxy resin was large; the adhesive force (180° C.) was large, and the migration property was poor. Further, the peeled state between the mold release film and the resin sealed portion, and the result in the appearance of the exposed portion of the semiconductor chip, were also poor. This is considered to be such that since the crosslinkably functional group equivalent amount was large, the crosslinking density was low, and therefore, the elastic modulus of the adhesive layer did not become sufficiently high, thus resulting in sticking strongly to the epoxy resin or the exposed portion. Further, it is considered that since the crosslinking density was low, the low molecular weight material contained in the adhesive layer bleeded out and contaminated the chip. Further, it is considered that if a large amount of a cross-linking agent (polyfunctional isocyanate compound) was incorporated in order to increase the cross-linking density as in Ex. 10 and 11, an unreacted crosslinking agent remained, and migrated to the exposed portion at the time of sealing to contaminate it.

In the case of the mold release film in Example 12 wherein $M_{COOH}/(M_{NCO}-M_{OH})$ was 2.1 and the mold release film in Example 15 wherein $M_{COOH}/(M_{NCO}-M_{OH})$ was 1.2, the peeling force (180° C.) of the epoxy resin was large. Further, the peeled state between the mold release film and the resin sealed portion was poor. This is considered to be such that free carboxy groups remained in the adhesive layer, and the carboxy groups and the epoxy groups of the curable resin were reacted for bonding.

In the case of the mold release film in Ex. 17 wherein $M_{NCO}/(M_{COOH}+M_{OH})$ was 4.45, the migration property was poor. Further, the result of the appearance of the exposed portion of the semiconductor chip was also poor. This is considered to be such that since a large amount of a cross-linking agent was incorporated in order to increase the crosslink density, an unreacted crosslinking agent remained and migrated to the exposed portion at the time of sealing to contaminate it.

This application is a continuation of PCT Application No. PCT/JP2016/053072, filed on Feb. 2, 2016, which is based upon and claims the benefit of priority from Japanese Patent Application No. 2015-022691 filed on Feb. 6, 2015. The contents of those applications are incorporated herein by reference in their entireties.

REFERENCE SYMBOLS

1: mold release film, 3: substrate, 5: adhesive layer, 10: semiconductor element, 11: substrate, 13: semiconductor chip, 15: bump, 17: resin sealed portion, 19: cured product, 20: upper mold, 21: cavity, 23: cavity surface, 25: resin introduction portion, 30: lower mold, 31: substrate placement unit, 33: resin placement unit, 35: plunger, 40: curable resin, 50: semiconductor element, 51: substrate, 53: semiconductor chip, 55a to 55b: bonding wire, 57: a resin sealed portion, 59: sealing glass, 61: rib member, 100: sealed body

What is claimed is:

1. A film comprising a substrate and an adhesive layer provided on one surface of the substrate, characterized in that
the storage elastic modulus at 180° C. of the substrate is from 10 to 100 MPa,
the adhesive layer is a reaction cured product of a composition for adhesive layer comprising an acrylic polymer having hydroxy groups, and a polyfunctional isocyanate compound, the total equivalent amount of hydroxy groups and carboxy groups in the acrylic polymer is at most 2,000 g/mol, in the composition for adhesive layer, $M_{COOH}/(M_{NCO}-M_{OH})$ is from 0 to 1.0, and $M_{NCO}/(M_{COOH}+M_{OH})$ is from 0.4 to 3.5 (wherein $M_{OH}$ is the number of moles $M_{OH}$ of hydroxy groups derived from the acrylic polymer, $M_{COOH}$ is the number of moles of carboxy groups derived from the acrylic polymer, and $M_{NCO}$ is the number of moles of isocyanate groups derived from the polyfunctional isocyanate compound).

2. The film according to claim 1, wherein the mass average molecular weight of the acrylic polymer is from 100,000 to 1,200,000.

3. The film according to claim 1, wherein the polyfunctional isocyanate compound has an isocyanurate ring.

4. The film according to claim 1, wherein the storage elastic modulus at 180° C. of the adhesive layer is from 2 to 20 MPa.

5. The film according to claim 1, wherein the insolubility degree of the adhesive layer obtainable by the following formula from the basis weight W1 (g/m²) of the adhesive layer and the basis weight W2 (g/m²) of the adhesive layer remaining after subjecting the film to the following dissolution test, is from 40 to 90%:

Insolubility Degree (%)=(W2/W1)×100

<Dissolution Test>

The film is immersed in methylene chloride at from 20 to 25° C. and stirred for one day; the film after completion of the stirring for one day is immersed and washed for 10 minutes in another methylene chloride at from 20 to 25° C.; and the film after the washing is vacuum-dried at 100° C. for two hours.

6. The film according to claim 1, wherein the substrate contains an ethylene-tetrafluoroethylene copolymer.

7. The film according to claim 1, wherein the thickness of the substrate is from 50 to 100 μm, and the thickness of the adhesive layer is from 0.5 to 15 μm.

8. The film according to claim 1, wherein the composition for adhesive layer further contains an antistatic agent.

9. The film according to claim 1, which has an antistatic layer between the substrate and the adhesive layer.

10. The film according to claim 1, which is a mold release film to be used in a sealing process for producing a semiconductor element sealed with a sealing resin.

11. The film according to claim 10, wherein the semiconductor element sealed with a sealing resin, is a semiconductor element having a part of the surface of a semiconductor chip, a source electrode or a sealing glass exposed from the sealing resin.

12. The film according to claim 10, which is a mold release film to be used so that when the curable resin is cured and formed into the sealing resin in a mold in the sealing process, the substrate-side surface of the mold release film is in contact with the mold inner surface, and the surface of the adhesive layer of the mold release film is in contact with a part of the surface of a semiconductor chip.

13. The film according to claim 1, which is a mold release film to be used in the following sealing process:

Sealing process: A sealing process comprising a step of disposing the mold release film on the surface of a mold to be in contact with a curable resin so that its substrate side surface is in contact with the mold surface, and disposing, in the mold, a structure having a semiconductor chip, and having a source electrode or a sealing glass, a step of clamping the mold so that the mold is, via the mold release film, in contact with the surface of the semiconductor chip, the source electrode or the sealing glass, a step of filling and curing the curable resin in the mold while clamping the mold, to form a resin sealed portion, thereby to obtain a sealed body having said structure and said resin sealed portion and having a part of the surface of the semiconductor chip, source electrode or sealing glass exposed, and a step of releasing the sealed body from the mold.

14. A method for producing the film as defined in claim 1, characterized by comprising a step of forming the adhesive layer by applying and drying a coating liquid for adhesive layer comprising the composition for adhesive layer and a liquid medium on one surface of a substrate.

15. A method for producing a semiconductor element having a semiconductor chip and a resin sealed portion, and having a source electrode or a sealing glass, and having a part of the surface of the semiconductor chip, source electrode or sealing glass exposed, characterized by comprising a step of disposing the film as defined in claim 1 on the surface of a mold to be in contact with a curable resin, so that its substrate side surface is in contact with the mold surface, and disposing, in the mold, a structure having a semiconductor chip and having the source electrode or the sealing glass, a step of clamping the mold, so that the mold is, via the mold release film, in contact with the surface of the semiconductor chip, electrode or sealing glass, a step of filling and curing the curable resin in the mold, while clamping the mold, to form the resin sealed portion, thereby to obtain a sealed body having said structure and said resin sealed portion, and having a part of the surface of the semiconductor chip, source electrode or sealing glass exposed, and a step of releasing the sealed body from the mold.

* * * * *